(12) United States Patent
Cheng

(10) Patent No.: US 12,237,267 B2
(45) Date of Patent: Feb. 25, 2025

(54) MEMORY DEVICES AND METHODS OF MANUFACTURING THEREOF

(71) Applicant: Taiwan Semiconductor Manufacturing Company, Ltd., Hsinchu (TW)

(72) Inventor: Chung-Liang Cheng, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 470 days.

(21) Appl. No.: 17/586,740

(22) Filed: Jan. 27, 2022

(65) Prior Publication Data
US 2023/0238324 A1 Jul. 27, 2023

(51) Int. Cl.
*H01L 23/528* (2006.01)
*H01L 29/06* (2006.01)
(Continued)

(52) U.S. Cl.
CPC ...... *H01L 23/5286* (2013.01); *H01L 29/0669* (2013.01); *H01L 29/42392* (2013.01);
(Continued)

(58) Field of Classification Search
CPC ........ H10B 63/30; H10B 12/30; H10B 51/20; H10B 63/34; H10B 63/10; H10B 61/22; H10B 12/05; H10B 12/50; H10B 12/02; H10B 12/31; H01L 29/66439; H01L 29/42392; H01L 29/78696; H01L 29/78618; H01L 29/0669; H01L 23/5286; H01L 29/41725; H01L 29/78642; H01L 29/0673; H01L 29/66545; H01L 29/775; H01L 27/1225; H01L 29/7869; H01L 27/1203; H01L 27/1207; H01L 21/8221;
(Continued)

(56) References Cited

U.S. PATENT DOCUMENTS

| 10,108,771 | B2 | 10/2018 | Kim et al. |
| 2018/0025970 | A1* | 1/2018 | Kao ..................... H01L 27/0688 257/401 |

(Continued)

FOREIGN PATENT DOCUMENTS

| CN | 106158867 A | 11/2016 |
| TW | 202141729 A | 11/2021 |

OTHER PUBLICATIONS

Taiwan Office Action issued in connection with TW Appl. Ser. No. 111110755 dated Feb. 21, 2023, without English translation (6 pages).

*Primary Examiner* — Mouloucoulaye Inoussa
(74) *Attorney, Agent, or Firm* — FOLEY & LARDNER LLP

(57) ABSTRACT

A semiconductor device includes a first transistor formed on a first side of a substrate. The semiconductor device includes a first power rail structure vertically disposed over the first transistor, a second power rail structure vertically disposed over the first power rail structure, and a memory portion vertically disposed over the second power rail structure. The first power rail structure, and a second power rail structure, and the memory portion are all disposed on a second side of the substrate opposite to the first side.

20 Claims, 19 Drawing Sheets

(51) Int. Cl.
*H01L 29/423* (2006.01)
*H01L 29/786* (2006.01)
*H10B 12/00* (2023.01)
*H10B 51/20* (2023.01)
*H10B 61/00* (2023.01)
*H10B 63/00* (2023.01)

(52) U.S. Cl.
CPC .. *H01L 29/78618* (2013.01); *H01L 29/78696* (2013.01); *H10B 12/30* (2023.02); *H10B 51/20* (2023.02); *H10B 61/22* (2023.02); *H10B 63/34* (2023.02)

(58) Field of Classification Search
CPC ............... H01L 27/088; H01L 27/0688; H01L 21/823475; H01L 23/5226; H01L 21/02496; H01L 21/823412; H01L 29/78654; H01L 21/02592; H01L 21/02532; H01L 29/66772; H01L 21/0262; H01L 25/50; H01L 23/525; H01L 23/53295; H01L 29/0649; H01L 21/823481; H01L 29/1079; H01L 21/823431; H01L 27/0886; H01L 29/785; H01L 21/823437; H01L 21/76898; H01L 23/535; H01L 21/76897; H01L 23/481; H01L 29/66469; H01L 27/0924; H01L 29/41733; H01L 21/823807; H01L 29/41791; H01L 29/0653; H01L 21/823871; H01L 27/092; H01L 21/823828; H01L 21/823814; H01L 21/823821; H01L 29/42372; H01L 21/823842; H01L 21/823878; H01L 25/0657; H01L 24/29; H01L 25/18; H01L 24/83; H01L 23/49816; H01L 23/5385; H01L 27/1255; H01L 2224/11; H01L 2225/06541; H01L 2224/48227; H01L 2924/13091; H01L 2924/14; H01L 2221/6834; H01L 2221/68381; H01L 2221/68327; H01L 2224/0401; H01L 2221/6835; H01L 2224/29187; H01L 2224/32146; H01L 2924/1436; H01L 24/32; B82Y 10/00; H10N 70/011; H10N 50/10; H10N 50/01; H10N 70/231; G11C 13/0004; G11C 11/161; G11C 11/16

See application file for complete search history.

(56) References Cited

U.S. PATENT DOCUMENTS

| | | | |
|---|---|---|---|
| 2019/0148376 A1* | 5/2019 | Chanemougame | H01L 27/0688 257/532 |
| 2019/0348540 A1* | 11/2019 | Pillarisetty | H01L 21/823475 |
| 2020/0105671 A1* | 4/2020 | Lai | G06F 30/39 |
| 2020/0294998 A1* | 9/2020 | Lilak | H01L 23/53295 |
| 2021/0050341 A1* | 2/2021 | Wang | H01L 27/0248 |
| 2021/0202475 A1* | 7/2021 | Hu | H01L 27/1203 |
| 2021/0210636 A1* | 7/2021 | Chiang | H01L 29/516 |
| 2021/0233834 A1* | 7/2021 | Chen | H01L 23/5286 |
| 2021/0296396 A1* | 9/2021 | Wu | H10N 70/011 |
| 2021/0305252 A1* | 9/2021 | Chiang | H01L 29/7851 |
| 2021/0335690 A1* | 10/2021 | Huang | H01L 29/42392 |
| 2021/0343578 A1* | 11/2021 | Chang | B82Y 10/00 |
| 2021/0358842 A1* | 11/2021 | Huang | H01L 23/5329 |
| 2021/0359091 A1* | 11/2021 | Hsu | H01L 21/823418 |
| 2021/0366906 A1* | 11/2021 | Huang | H01L 29/42392 |
| 2021/0408249 A1* | 12/2021 | Yu | H01L 29/66545 |
| 2022/0037192 A1* | 2/2022 | Yu | H01L 21/76832 |
| 2022/0045050 A1* | 2/2022 | Kim | H01L 29/66666 |
| 2022/0123023 A1* | 4/2022 | Peng | H01L 27/124 |
| 2022/0237358 A1* | 7/2022 | Yang | G06F 30/398 |
| 2022/0310638 A1* | 9/2022 | Cheng | H01L 29/78696 |
| 2022/0415904 A1* | 12/2022 | Sharma | H01L 23/481 |
| 2023/0065446 A1* | 3/2023 | Cheng | H01L 27/1266 |

* cited by examiner

MEMORY DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
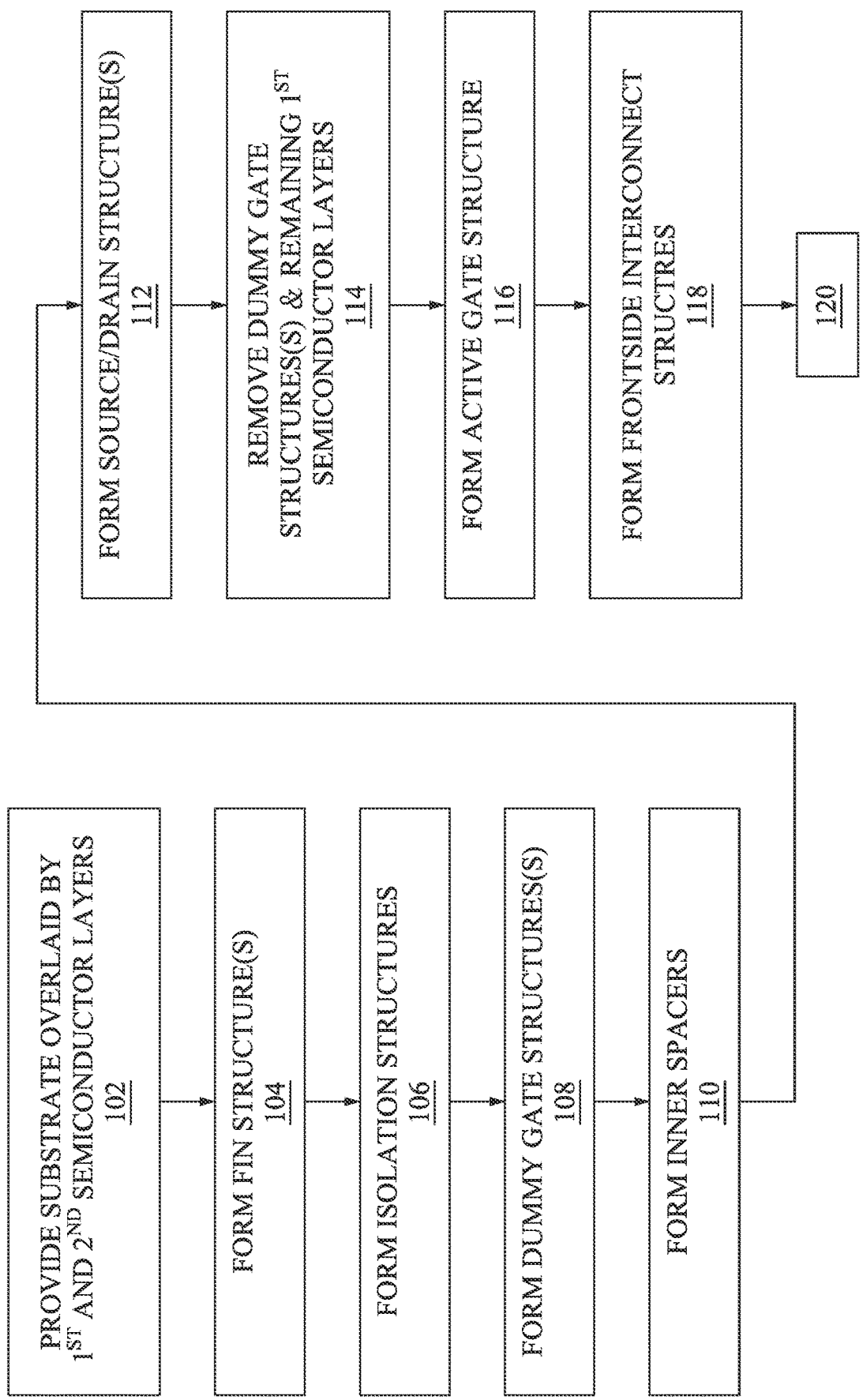
FIG. 1 is a flow chart of an example method for fabricating a semiconductor device, in accordance with some embodiments.
Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures such as nanostructure transistors (e.g., nanosheet transistors, nanowire transistors, gate-all-around (GAA) transistors, multi bridge channel (MBC) transistors, etc.) can further increase device performance. The nanostructure transistor, in general, includes a gate structure that wraps around the perimeter of one or more nanostructures for improved control of channel current flow.

Such a nanostructure transistor generally allows one or more power rails to be more efficiently formed on its backside, given the nature of how the nanostructure transistor is formed. In comparison, a planar transistor device architecture typically requires corresponding power rails to be formed on top of the transistors (e.g., typically referred to as a part of a back-end-of-line (BEOL) routing). As such, a number of interconnect structures (e.g., conductive lines, vias) are also formed in the BEOL routing to operatively couple the power rails to the transistors, which can disadvantageously induce additional voltage drop (e.g., IR drop). Further, in the existing technologies, to integrate these transistors into a part of a memory device, a number of memory cells are also formed in the BEOL routing, with the transistors functioning as logic devices (e.g., drivers) of the memory device. With all of these interconnect structures, memory cells, and power rails formed within the same space (e.g., the BEOL routing), it becomes increasingly challenging to integrate more memory cells within a given area partially because, for example, the increasing difficulty to reduce dimensions of the transistors (i.e., forming more transistors within the area). Thus, the existing memory devices have not been entirely satisfactory in many aspects.

The present disclosure provides various embodiments of a semiconductor device (e.g., a memory device) that includes a logic portion and a memory portion. In various embodiments, the logic portion, which includes a number of transistors functioning as logic devices, may be formed on a frontside of a substrate; and the memory portion, which includes a number of memory cells, may be formed on a backside of the substrate. Further, one or more first power rails and one or more second power rails may be (e.g., vertically) formed between the logic portion and the memory portion, where the first power rail(s) and the second power rail(s) are configured to carry (or otherwise provide) supply voltages to the logic portion and memory portion, respectively. For example, the transistors in the logic portion may each be formed as a nanostructure transistor (e.g., a GAA transistor), with the first power rails vertically disposed below and operatively coupled to the nanostructure transistors. The second power rails may be vertically disposed next below the first power rails, with the memory portion vertically disposed next below the second power rails. Such configuration allows more compact design for the disclosed semiconductor device. As a result, dimensions (e.g., a gate pitch) of the transistors in the logic portion can be further reduced, which allows more transistors to be formed within a given area. In turn, the memory device, as disclosed herein, can have more memory cells integrated therein within the same area (i.e., a higher density of memory cells).

FIG. 1 illustrates a flow chart of an example method 100 for making a semiconductor device in accordance with some embodiments. It should be noted that the method 100 is merely an example and is not intended to limit the present disclosure. Accordingly, it is understood that additional steps/operations may be provided before, during, and after the method 100 of FIG. 1, and that some other operations may only be briefly described herein. Operations of the method 100 may be associated with cross-sectional views of an example semiconductor device 300 at various fabrication stages as shown in FIGS. 3, 4, 5, 6, 7, 8, 9, 10, 11, and 12, respectively, which will be discussed in further detail below.

In brief overview, the method 100 starts with operation 102 of providing a substrate overlaid by first and second semiconductor layers. Next, the method 100 proceeds to operation 104 of forming the semiconductor fin. The method 100 proceeds to operation 106 of forming isolation structures. The method 100 proceeds to operation 108 of forming dummy gate structures over the semiconductor fin. The method 100 proceeds to operation 110 of forming inner spacers. The method 100 proceeds to operation 112 of forming a source and/or drain structures. The method 100 proceeds to operation 114 of removing dummy gate structures and the first semiconductor layers. The method 100 proceeds to operation 116 of forming active gate structures. The method 100 proceeds to operation 118 of forming frontside interconnect structures. Next, the method 100 proceeds to operation 120 of flipping the workpiece for further manufacturing. The method 100 proceeds to operation 122 of forming first backside power rail structures. The method 100 proceeds to operation 124 of forming second backside power rail structures. The method 100 proceeds to operation 126 of forming a memory portion of the disclosed semiconductor device.

Figure 2:
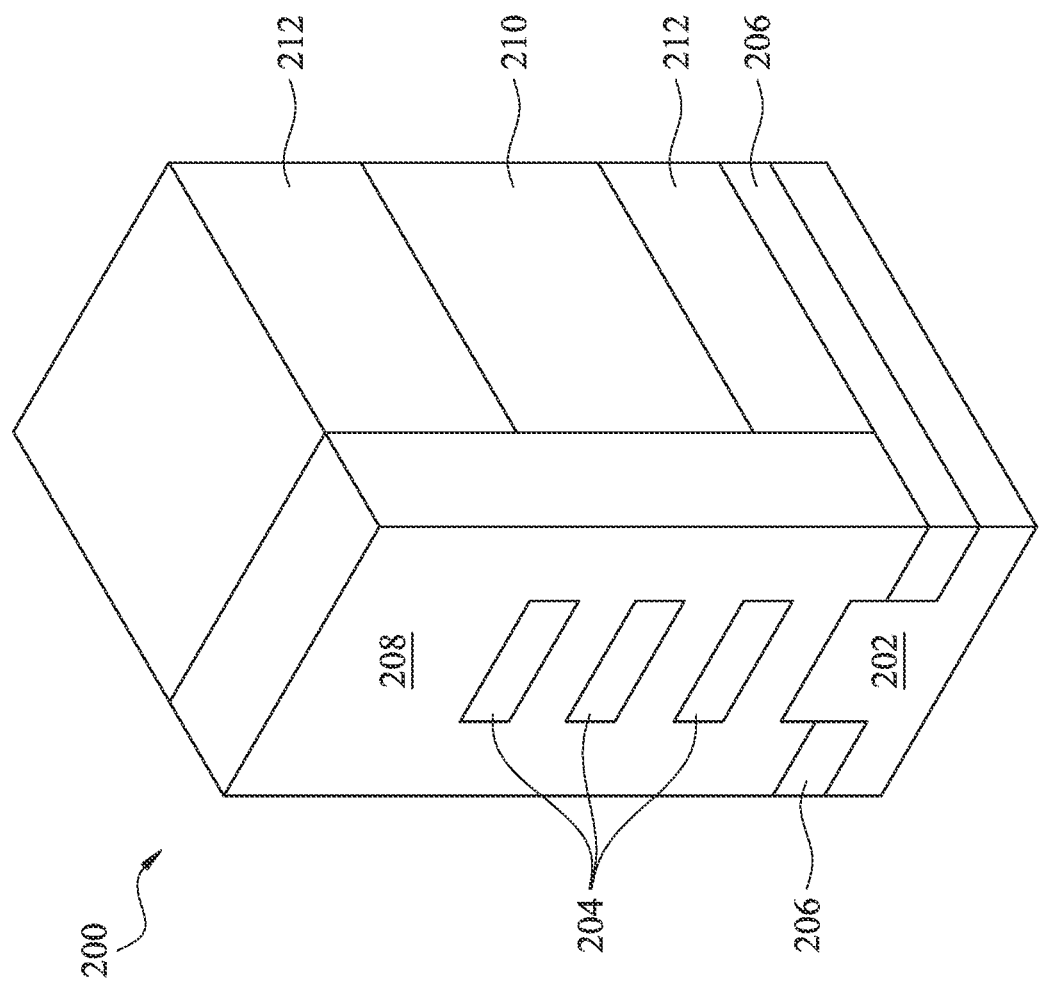
FIG. 2 illustrates a perspective view of a gate-all-around (GAA) field-effect-transistor (FET) device, in accordance with some embodiments.

FIG. 2 illustrates a perspective view of an example gate-all-around (GAA) field-effect-transistor (FET) 200, which is an example transistor of the logic portion of the disclosed semiconductor device, in accordance with some embodiments. The GAA FET 200 includes a substrate 202 and a number of semiconductor layers (e.g., nanosheets, nanowires, or otherwise nanostructures) 204 above the substrate 202. The semiconductor layers 204 are vertically separated from one another, which can collectively function as a (conduction) channel of the GAA FET 200. Isolation regions/structures 206 are formed on opposing sides of a protruding portion of the substrate 202, with the semiconductor layers 204 disposed above the protruding portion. A gate structure 208 wraps around each of the semiconductor layers 204 (e.g., a full perimeter of each of the semiconductor layers 204). Source/drain structures are disposed on opposing sides of the gate structure 208 with the spacer 209 disposed therebetween, e.g., one of such source/drain structures 210 shown in FIG. 2. An interlayer dielectric (ILD) 212 is disposed over and may extend below a portion of the source/drain structure 210.

The GAA FET shown in FIG. 2 is simplified, and thus, it should be understood that one or more features of a completed GAA FET may not be shown in FIG. 2. For example, the other source/drain structure opposite the gate structure 208 from the source/drain structure 210 and the ILD disposed over such a source/drain structure are not shown in FIG. 2. Further, FIG. 2 is provided as a reference to illustrate a number of cross-sections in subsequent figures. For example, FIGS. 3-13 illustrate cross-sectional views of the example semiconductor device 300 during various fabrication stages, made by method 100. In various embodiments, the cross-sectional views of the semiconductor device 300, which includes a number of the GAA FETs 200 shown in FIG. 2, may be cut along a lengthwise direction of the semiconductor layers 204 (e.g., along the Y-direction shown in FIG. 2) or a lengthwise direction of the gate structure 208 (e.g., along the X-direction shown in FIG. 2), which will be respectively described as follows.

Figure 3:
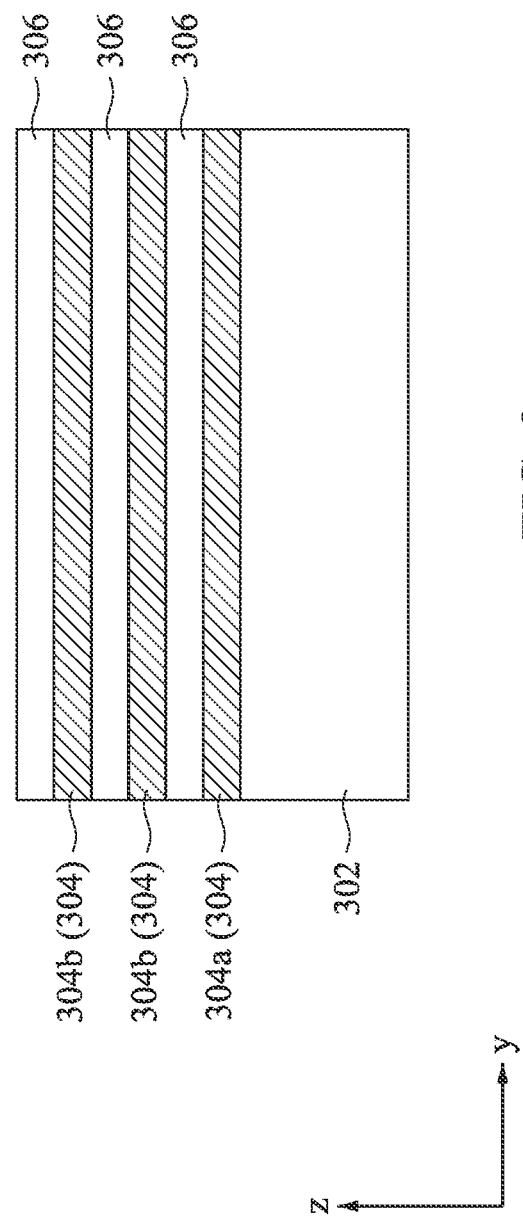
FIGS. 3, 4, 5, 6, 7, 8, 9, 10, 11, and 12 illustrate cross-sectional views of an example semiconductor device during various fabrication stages, made by the method of FIG. 1, in accordance with some embodiments.

Corresponding to operation 102 of FIG. 1, FIG. 3 is a cross-sectional view of the semiconductor device 300 cut along the Y-direction (FIG. 2), which includes a number of first semiconductor layers 304 and a number of second semiconductor layers 306 alternatingly disposed on top of one another over a substrate 302, in accordance with various embodiments.

Such alternately stacked first semiconductor layers 304 and second semiconductor layers 306 may be formed as a stack over a frontside of the substrate 302. For example, one of the second semiconductor layers 306 is disposed over one of the first semiconductor layers 304, then another one of the first semiconductor layers 304 is disposed over the second semiconductor layer 306, so on and so forth. For example in the illustrated embodiments of FIG. 3 (and the following figures), the stack may include 3 first semiconductor layers 304, with 2 second semiconductor layers 306 alternatingly disposed therebetween and with one of the second semiconductor layer 306 being the topmost semiconductor layer. It should be understood that the semiconductor device 300 can include any number of first semiconductor layers 304 (which respectively serve as sacrificial layers) and any number of second semiconductor layers 306 (which respectively serve as channel layers), with either one of them being the topmost layer, while remaining within the scope of the present disclosure.

The semiconductor substrate 302 includes a semiconductor material substrate, for example, silicon. Alternatively, the semiconductor substrate 302 may include other elementary semiconductor material such as, for example, germanium. The semiconductor substrate 302 may also include a compound semiconductor such as silicon carbide, gallium arsenic, indium arsenide, and indium phosphide. The semiconductor substrate 302 may include an alloy semiconductor such as silicon germanium, silicon germanium carbide, gallium arsenic phosphide, and gallium indium phosphide. In one embodiment, the semiconductor substrate 302 includes an epitaxial layer. For example, the semiconductor substrate 302 may have an epitaxial layer overlying a bulk semiconductor. Furthermore, the semiconductor substrate 302 may include a semiconductor-on-insulator (SOI) structure. For example, the semiconductor substrate 302 may include a buried oxide (BOX) layer formed by a process such as separation by implanted oxygen (SIMOX) or other suitable technique, such as wafer bonding and grinding.

The semiconductor layers 304 and 306 may have different thicknesses. The first semiconductor layers 304 may have different thicknesses from one layer to another layer. The second semiconductor layers 306 may have different thicknesses from one layer to another layer. The thickness of each of the semiconductor layers 304 and 306 may range from few nanometers to few tens of nanometers. The first layer of the stack may be thicker than other semiconductor layers 304 and 306. In an embodiment, each of the first semiconductor layers 304 has a thickness ranging from about 5 nanometers (nm) to about 20 nm, and each of the second semiconductor layers 306 has a thickness ranging from about 5 nm to about 20 nm. Either the first semiconductor layer 304 or the second semiconductor layer 306 may be the topmost layer (or the layer most distanced from the semiconductor substrate 302). In an embodiment, the first semiconductor layer 304 may be the bottommost layer (or the layer most proximate to the semiconductor substrate 302).

The two semiconductor layers 304 and 306 have different compositions. In various embodiments, the two semiconductor layers 304 and 306 have compositions that provide for different oxidation rates and/or different etch selectivity between the layers. In an embodiment, the first semiconductor layers 304 include silicon germanium ($Si_{1-x}Ge_x$), and the second semiconductor layers 306 include silicon (Si). In an embodiment, each of the second semiconductor layers 306 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 306 (e.g., of silicon).

In various embodiments, the second semiconductor layers 306 may be intentionally doped. For example, when the semiconductor device 300 is configured in n-type (and operates in an enhancement mode), each of the second semiconductor layers 306 may be silicon that is doped with a p-type dopant such as boron (B), aluminum (Al), indium (In), and gallium (Ga); and when the semiconductor device 300 is configured in p-type (and operates in an enhancement mode), each of the second semiconductor layers 306 may be silicon that is doped with an n-type dopant such as phosphorus (P), arsenic (As), antimony (Sb). In another example, when the semiconductor device 300 is configured in n-type (and operates in a depletion mode), each of the second semiconductor layers 306 may be silicon that is doped with an n-type dopant instead; and when the semiconductor device 300 is configured in p-type (and operates in a depletion mode), each of the semiconductor layers 306 may be silicon that is doped with a p-type dopant instead. In some embodiments, the bottommost first semiconductor layer 304a may have higher Ge molar ratio than other first semiconductor layers 304b.

In some embodiments, each of the first semiconductor layers 304 is $Si_{1-x}Ge_x$ that includes less than 50% (x<0.5) Ge in molar ratio. For example, Ge may comprise about 15% to 35% of the first semiconductor layers 304 of $Si_{1-x}Ge_x$ in molar ratio. Furthermore, the first semiconductor layers 304 may include different compositions among them, and the second semiconductor layers 306 may include different compositions among them. Either of the semiconductor layers 304 and 306 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, any other suitable material, or combinations thereof. The materials of the semiconductor layers 304 and 306 may be chosen based on providing differing oxidation rates and/or etch selectivity.

The semiconductor layers 304 and 306 can be grown from the semiconductor substrate 302. For example, each of the semiconductor layers 304 and 306 may be grown by a molecular beam epitaxy (MBE) process, a chemical vapor deposition (CVD) process such as a metal organic CVD (MOCVD) process, and/or other suitable growth processes. During the epitaxial growth, the crystal structure of the semiconductor substrate 302 extends upwardly, resulting in the semiconductor layers 304 and 306 having the same crystal orientation with the semiconductor substrate 302. The semiconductor layers 304 and 306 continuously extend along the X-direction.

Figure 4:
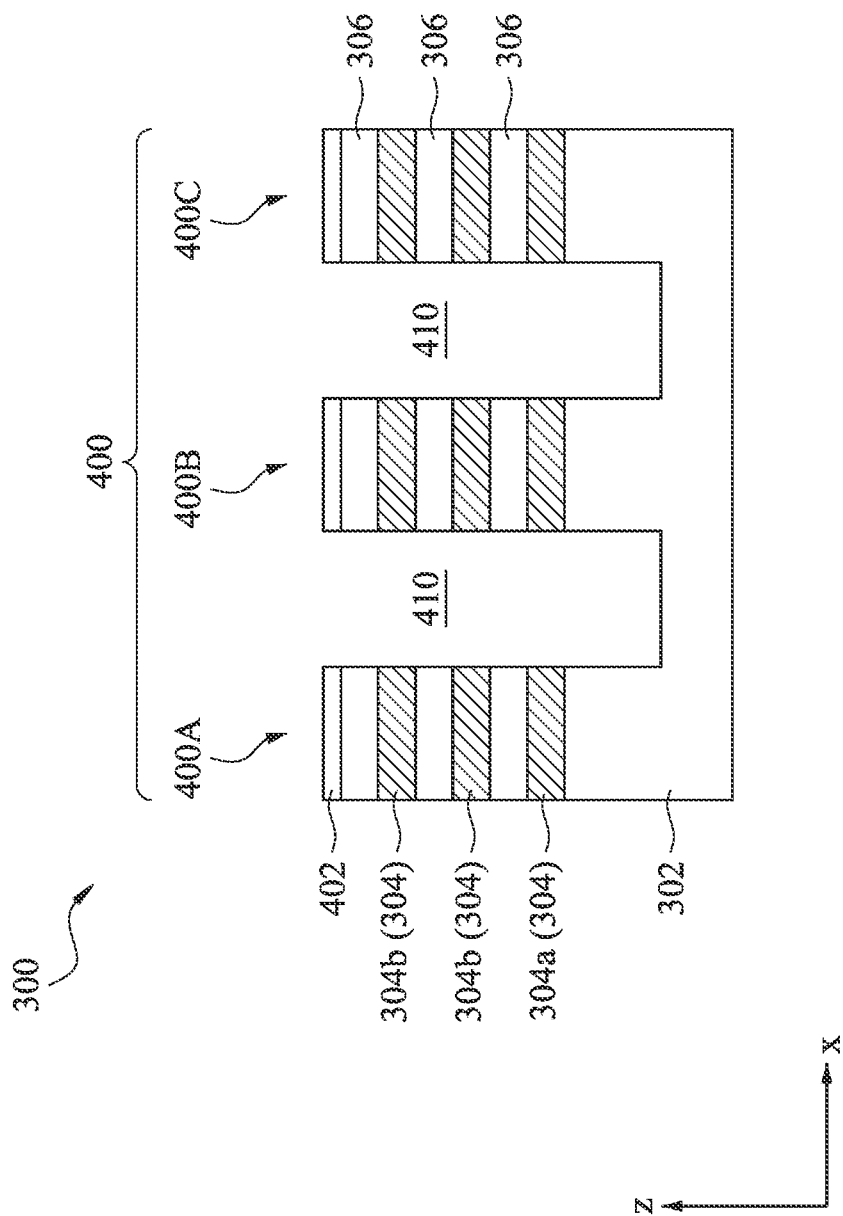

Corresponding to operation 104 of FIG. 1, FIG. 4 is a cross-sectional views of the semiconductor device 300, cut along the X-direction (FIG. 2), which includes a number of fin structures 400A, 400B, and 400C (which may sometimes be referred to as fin structures 400) at one of the various stages of fabrication, in accordance with various embodiments.

Each of the fin structures 400, which is elongated along the Y-direction, can include a stack of semiconductor layers 304-306 alternatively stacked with each other. Although three fin structures are shown in the illustrated embodiment of FIG. 4 (and the following figures), it should be appreciated that the semiconductor device 300 can include any number of fin structures while remaining within the scope of the present disclosure.

The fin structures 400 are formed by patterning the semiconductor layers 304-306 and the semiconductor substrate 302 using, for example, photolithography and etching techniques. For example, a mask layer (which can include multiple layers such as, for example, a pad oxide layer and an overlying pad nitride layer) is formed over the topmost semiconductor layer 306 (FIG. 3). The pad oxide layer may be a thin film comprising silicon oxide formed, for example, using a thermal oxidation process. The pad oxide layer may act as an adhesion layer between the topmost semiconductor layer 306 (or the semiconductor layer 304 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask 402, as illustrated in FIG. 4.

The patterned mask 402 is subsequently used to pattern exposed portions of the semiconductor layers 304-306 and the substrate 302 to form trenches (or openings) 410, thereby defining the fin structures 400 between adjacent trenches 410, as illustrated in FIG. 4. The trenches 410 continuously extend along the Y-direction. When multiple fin structures are formed, such a trench may be disposed between any adjacent ones of the fin structures. In some embodiments, the fin structures 400 are formed by etching trenches in the semiconductor layers 304-306 and the substrate 302 using, for example, reactive ion etch (RIE), neutral beam etch (NBE), the like, any other suitable process, or combinations thereof. The etch may be anisotropic. In some embodiments, the trenches 410 may be strips (when viewed from the top) parallel to each other, and closely spaced with respect to each other. In some embodiments, the trenches 410 may be continuous and surround the fin structures 400.

Figure 5:
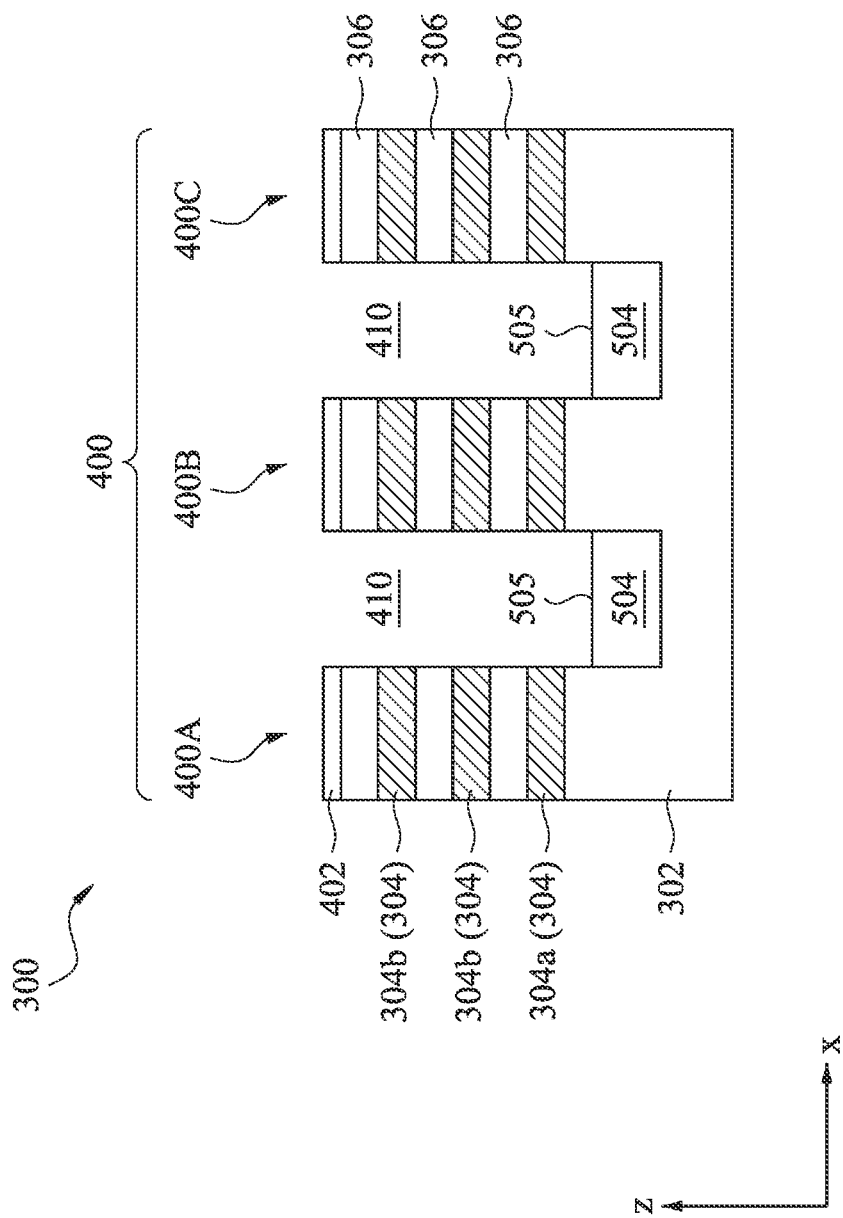

Corresponding to operation 106 of FIG. 1, FIG. 5 is a cross-sectional view cut along the X-direction of the semiconductor device 300 (FIG. 2), which includes a number of isolation structures 504 (sometimes referred to as isolation regions) at one of the various stages of fabrication, in accordance with various embodiments. As shown in FIG. 5, each of the isolation structures 504 can be disposed between adjacent ones of the fin structures 400, and partially embed respective lower portions of the adjacent fin structures 400.

The isolation structures 504, which are formed of an insulation material, can electrically isolate neighboring active structures (e.g., fin structures 400) from each other. The isolation structures 504 continuously extend in the Y-direction. The insulation material may be an oxide, such as silicon oxide, a nitride, the like, any other suitable material, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, any other suitable method, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process or any other suitable process, may remove any excess insulation material and form a top surface of the insulation material and a top surface of the patterned masks 402 that are coplanar (not shown). The patterned masks 402 may be removed by the planarization process, in some other embodiments Next, the insulation material is recessed to form the isolation structures 504, as shown in FIG. 5, which are sometimes referred to as shallow trench isolations (STIs). The isolation structures 504 are recessed such that the fin structures 400 protrude from between neighboring isolation structures 504. The isolation structures 504 may be recessed to where a top surface of the isolation structures 505 is below the substrate 302. Respective top surfaces of the isolation structures (STIs) 504 may have a flat surface (as illustrated), a convex surface, a concave surface (such as dishing), any other suitable surface, or combinations thereof. The top surfaces of the isolation structures 504 may be formed flat, convex, and/or concave by an appropriate etch. The isolation structures 504 may be recessed using an acceptable etching process, such as one that is selective to the material of the isolation structures 504. For example, a dry etch or a wet etch using dilute hydrofluoric (DHF) acid may be performed to recess the isolation structures 504.

Figure 6:
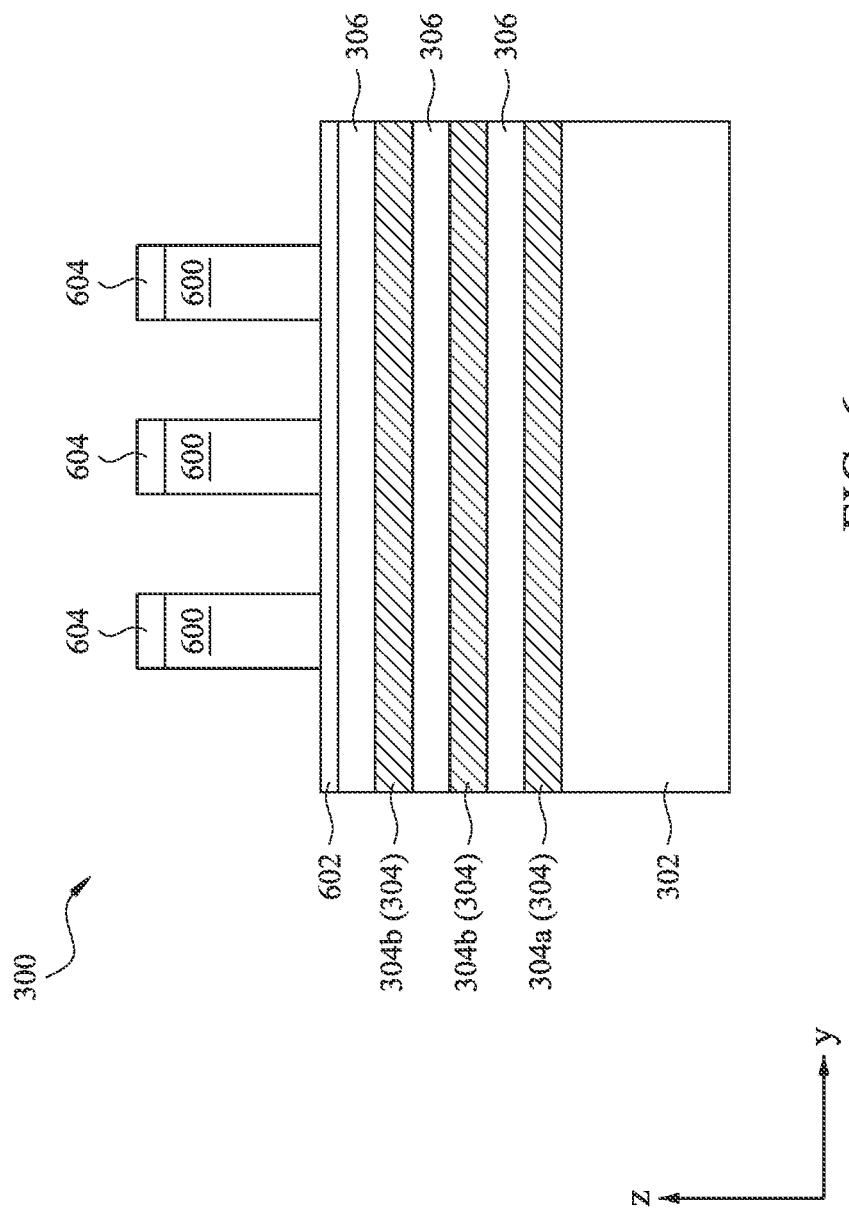

Corresponding to operation 108 of FIG. 1, FIG. 6 is a cross-sectional view cut along Y-direction of the semiconductor device 300 (FIG. 2), which includes a number of dummy gates structures 600 at one of the various stages of fabrication, in accordance with various embodiments. As shown in the illustrated example of FIG. 6, the dummy gate structures 600, continuously extending along the X-direction, can be formed over the workpiece. The dummy gate structures 600 are placed where an active (e.g., metal) gate structure may later be formed, in various embodiments. Three dummy gate structures 600 are shown in FIG. 6, but it is understood that any number of dummy gate structures 600 may be formed in a semiconductor device.

An etching stop layer 602 may be formed over a substantially top surface shared by the fin structures 400. As used herein, the term "substantially planar" refers to a structures where the deviation of the structures from a plane is within the statistical atomic level variations inherent within semiconductor processing methods known in the art. The etching stop layer 602 may include silicon oxide or any other suitable material. The etching stop layer 602 may be formed by a deposition process, such as CVD (such as PECVD, HARP, or combinations thereof) process, ALD process, another applicable process, or a combination thereof.

Next, the dummy gate structures 600 are formed over the etching stop layer 602. The dummy gate structures 600 include a dummy gate dielectric (not shown) and a dummy gate (not shown), in some embodiments. A mask 604 may be formed over the dummy gate structure 600. To form the dummy gate structure 600, a dielectric layer is formed over the etch stop layer 602. The dielectric layer may be, for example, silicon oxide, silicon nitride, silicon oxynitride, silicon carbide, silicon carbonitride, silicon oxycarbonitride, silicon oxycarbide, multilayers thereof, or any other suitable material and may be deposited or thermally grown.

A gate layer is then formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 604. The pattern of the mask 604 then may be transferred to the gate layer and the dielectric layer by a suitable etching technique to form the dummy gate structures 600. The dummy gate structures 600 each cover a respective central portion (e.g., a channel region) of each of the fin structures 400.

Figure 7:
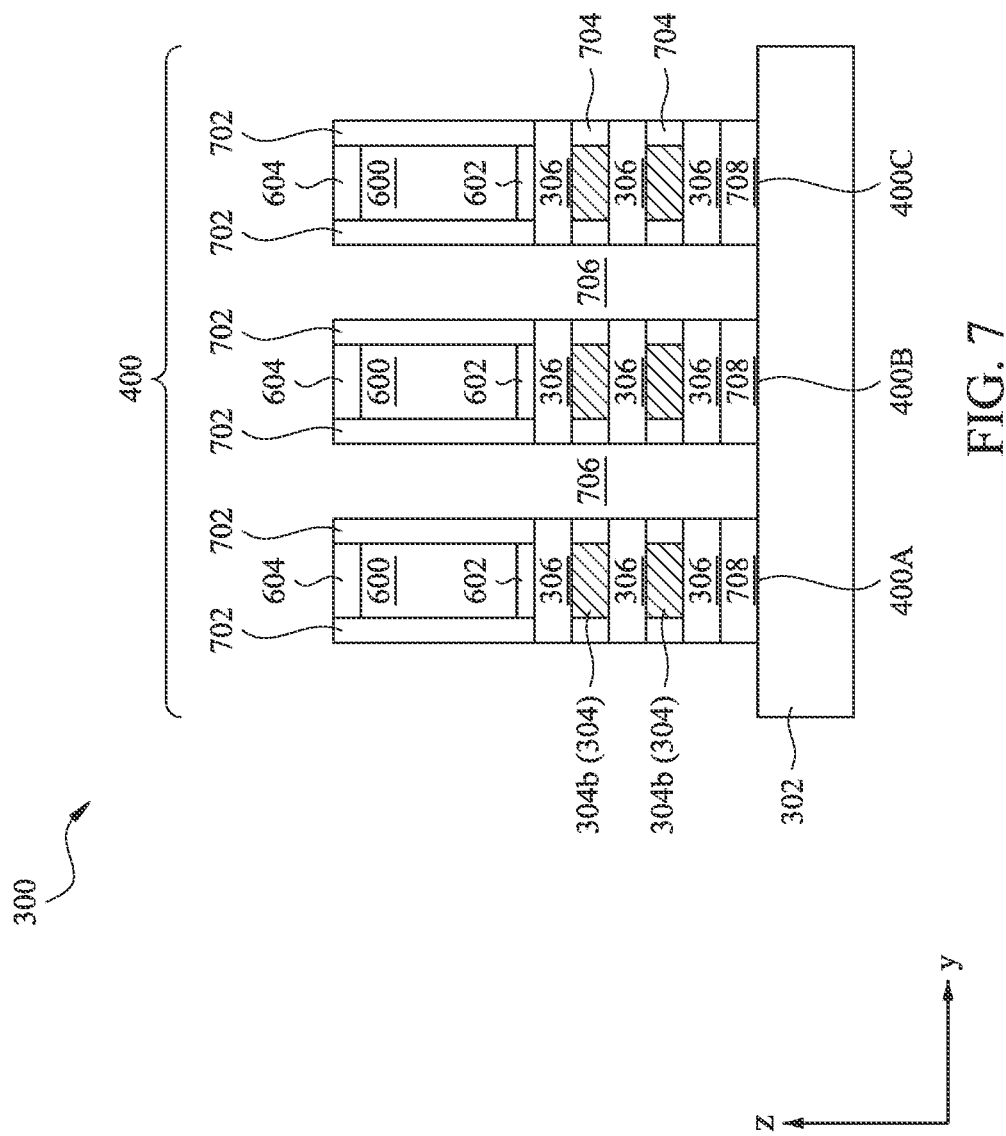

Corresponding to operation 110 of FIG. 1, FIG. 7 is a cross-sectional view cut along the Y-direction of the semiconductor device 300 (FIG. 2), which includes portions of the fin structures 400 (FIG. 4) not overlaid by the dummy structures 600 (and the corresponding gate spacers 702) and end portions of the semiconductor layers 304 are removed at one of the various stages of fabrication, in accordance with various embodiments.

After the formation of the dummy gate structures 600, the gate spacers 702 may be formed on opposing sidewalls (and extend along the X-direction) of each of the dummy gate structures 600. The gate spacers 702 may be low-k spacers and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 702. In some embodiments, the gate spacers 702 may have a thickness in the Y-direction in between about 1 nanometer and about 12 nanometers, inclusive (e.g., 1, 2, 5, 7, 10, 11, and 12 nanometers) or any other suitable thickness. The shapes and formation methods of the gate spacers 702 as illustrated and described in FIG. 7 are merely non-limiting examples, and other shapes and formation methods are possible. These and other variations are fully intended to be included within the scope of the present disclosure.

Next, the portions of the fin structures 400 that are not covered by the dummy gate structures 600 and the gate spacers 702 are removed by, for example, an anisotropic etching process using the dummy gate structures 600 as an etching mask, although any other suitable etching process may also be used. Upon the portions of the fin structures 400 being removed, source/drain recesses 706 are formed. The source/drain recesses 706 can each expose respective "shortened" ends (along the Y direction) of each of the semiconductor layers 304 and 306.

Upon the ends of the semiconductor layers 304 and 306 being exposed (e.g., when forming the source/drain recesses 706), respective end portions of each of the first semiconductor layers 304 may be concurrently removed. The end portions of the first semiconductor layers 304 can be removed (e.g., etched) using a "pull-back" process to pull the first semiconductor layers 304 by an initial pull-back distance such that the ends of the first semiconductor layers 304 terminate underneath (e.g., aligned with) the gate spacers 702. It is understood that the pull-back distance (i.e., the extent to which each of the semiconductor layers 304 is etched, or pulled-back) can be arbitrarily increased or decreased. In an example where the semiconductor layers 306 include Si, and the semiconductor layers 304 include $Si_{1-x}Ge_x$, the pull-back process may include a hydrogen chloride (HCL) gas isotropic etch process, which etches SiGe without attacking Si. As such, the semiconductor layers 306 may remain substantially intact during this process. In some embodiments in which the bottommost first semiconductor layer 304a has higher Ge molar ratio than other first semiconductor layers 304b, the bottommost first semiconductor layer 304a may be removed completely during such a pull-back process.

Next, the inner spacers 704 can be formed conformally by chemical vapor deposition (CVD), or by monolayer doping (MLD) of nitride followed by spacer RIE. The inner spacers 704 can be deposited using, e.g., a conformal deposition process and subsequent isotropic or anisotropic etch back to remove excess spacer material on the sidewalls of the fin structures 400 and on a surface of the semiconductor substrate 302. A material of the inner spacers 704 can be formed from the same or different material as the gate spacer 702 (e.g., silicon nitride). For example, the inner spacers 704 can be formed of silicon nitride, silicoboron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors. As mentioned above, the bottommost first semiconductor layer 304a may be removed completely during the pull-back process. Accordingly, such a cavity may be filled with the inner spacer material, thereby forming a bottom isolation layer 708, concurrently with forming the inner spacers 704. This bottom isolation layer 708 may serve as a stop layer for a polishing process performed on a backside of the substrate 302, which will be discussed below.

Figure 8:
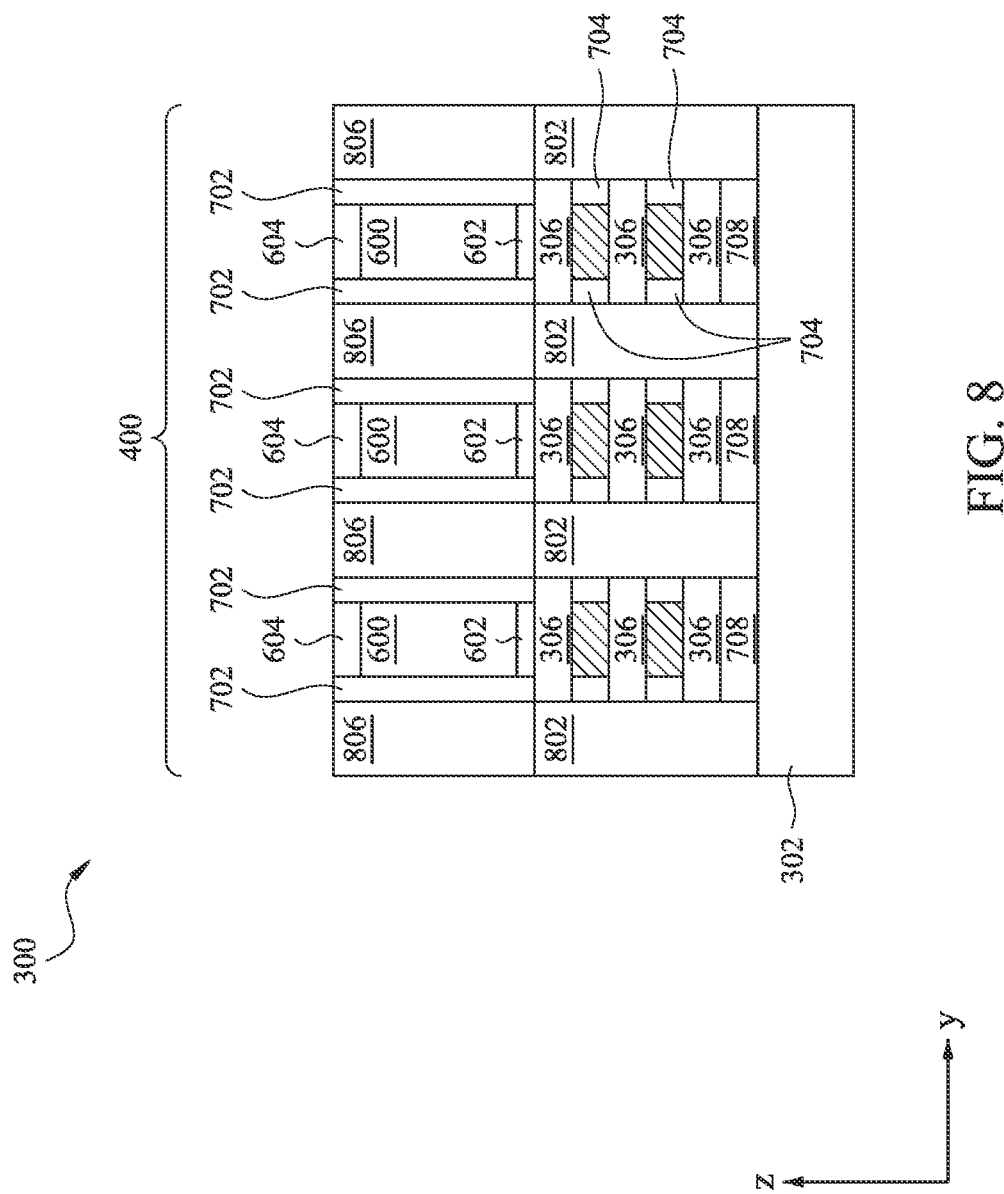

Corresponding to operations 112 of FIG. 1, FIG. 8 is a cross-sectional view cut along the Y-direction of the semiconductor device 300 (FIG. 2), which includes source/drain structures 802 (sometimes referred to as source/drain structures) at one of the various stages of fabrication, in accordance with various embodiments. As shown in FIG. 8, the source/drain structures 802 are formed in the source/drain recesses 706 (FIG. 7), respectively. The source/drain structures 802 are coupled to respective ends (along the X-direction) of the fin structures 400 (FIG. 4), e.g., the respective "shortened" or "etched" ends of each of the second semiconductor layers 306.

At operation 112, the source/drain structures 802 may each include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), any other suitable material, or combinations thereof. The source/drain structures 802 may be formed using an epitaxial layer growth process on exposed ends of each of the second semiconductor layers 306. In some embodiments, the source/drain structures 802 are aligned with the ends of the inner spacers 704 and the second semiconductor layers 306. In other embodiments, the second semiconductor layers 306 extend into the formed source/drain structures 802 in the Y-direction and may not be aligned with the ends of the inner spacers 704. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes. In some embodiments, a bottom surface of the source/drain structures 802 may be leveled with the top surface of the isolation structure 504 in the X-direction. In some other embodiments, the bottom surface of the source/drain structures 802 may be lower than the top surface of the isolation structure 504.

In-situ doping (ISD) may be applied to form doped source/drain structures 802, thereby creating the junctions for the semiconductor device 300. For example, when the semiconductor device 300 is configured in n-type, the source/drain structures 802 can be doped by implanting n-type dopants, e.g., arsenic (As), phosphorous (P), etc., into them. When the semiconductor device 300 is configured in p-type, the source/drain structures 802 can be doped by implanting p-type dopants, e.g., boron (B), etc., into them.

Upon forming the source/drain structures 802, an interlayer dielectric (ILD) 806 is formed to overlay the source/drain structures 802. In some embodiments, the ILD 806 is formed of a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. Next, a planarization process, such as a CMP process, may be performed to achieve a level top surface for the ILD 806. The CMP may also remove the mask 604 (FIG. 8). After the planarization process, the top surface of the ILD 806 is level with a top surface of the dummy gate structures 600, in some embodiments.

Figure 9:
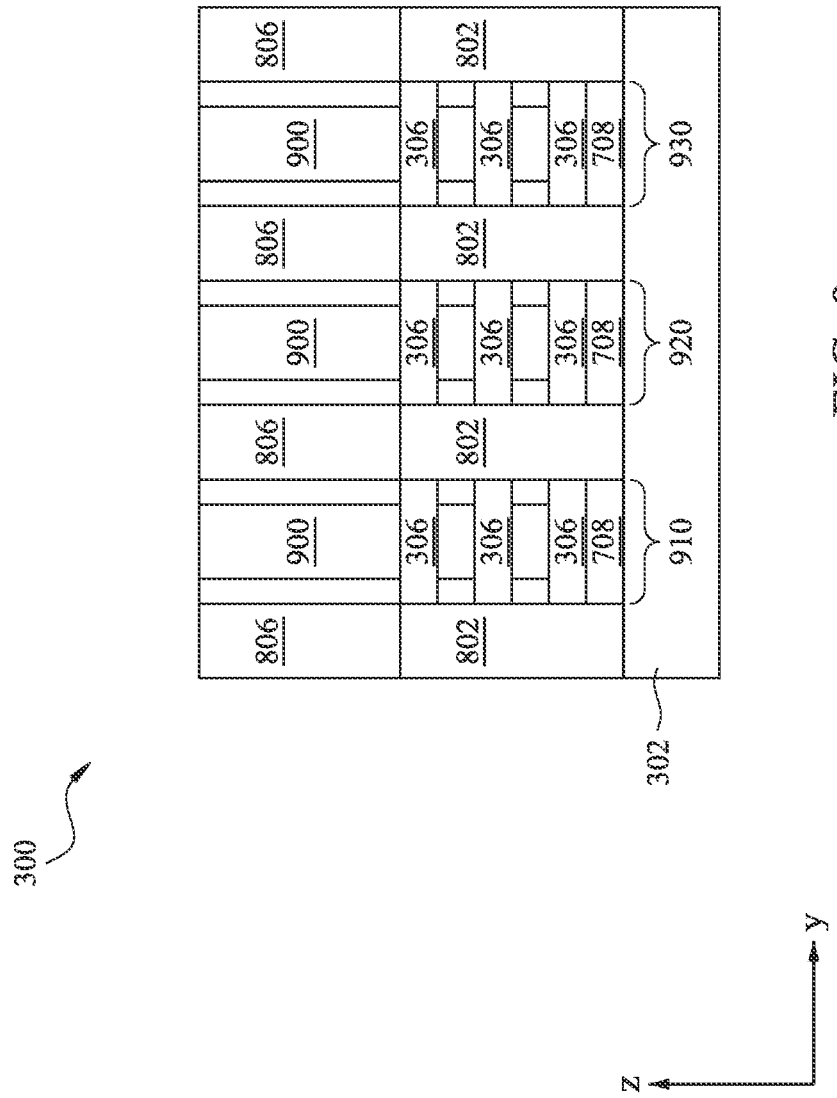

Corresponding to operation 116 of FIG. 1, FIG. 9 is a cross-sectional views cut along the Y-direction of the semiconductor device 300 in which the active gates structures 900 and metal contact layers 902 are formed at one of the various stages of fabrication, in accordance with various embodiments.

Referring again to operation 114, subsequently to forming the ILD 806 and performing CMP to expose the dummy gate structures 600 (FIG. 8), the dummy gate structures 600, the etch stop layer 602, the patterned mask 402 (if still present), and the first semiconductor layers 304 are sequentially removed. The dummy gate structures 600, the etch stop layer 602, and the patterned mask 402 (if any) can be removed by an etching process, e.g., RIE, chemical oxide removal (COR), or any other suitable process. After removing the dummy gate structures 600, the etch stop layer 602, and the patterned mask 402, the top surface of each of the fin structures 400 (e.g., the top surface of the topmost semiconductor layers 306) is exposed. In addition to the top surface, sidewalls of each fin structure 400 (facing the X-direction) may be exposed. Next, the first semiconductor layers 304 are removed from each of the fin structures 400 by applying a selective etch (e.g., a hydrochloric acid (HCl)), while leaving the second semiconductor layers 306 substantially intact. After the removal of the first semiconductor layers 304, respective bottom surface and top surface of each of the second semiconductor layers 306 may be exposed.

Then, at operation 116, one or more active gate structures 900 (sometimes referred to as gate structures) are formed. Each of the active gate structures includes a gate dielectric and a gate metal, in some embodiments. In some embodiments, each of the active gate structures 900 includes a gate dielectric and a gate metal (not separately shown in FIG. 9). In various embodiments, the active gate structures 900 may be disposed in the exposed cavities left by the dummy gate structures 600 and the first semiconductor layers 304. In some embodiments, the active gate structures 900 disposed above the second semiconductor layer 306 may have a height in the Z-direction in a range in between about 5 nanometers to 30 nanometers, inclusive (e.g., 5, 7, 10, 15, 20, 25, and 30 nanometers). In some embodiments, the active gate structures 900 disposed above the second semiconductor layers 306 may have a width in the Y-direction in a range in between about 9 and about 100 nanometers, inclusive (e.g., 9, 10, 15, 20, 30, 40, 50, 60, 70, 80, 90, and 100 nanometers).

The gate dielectric may be formed of different high-k dielectric materials or a similar high-k dielectric material. Example high-k dielectric materials include a metal oxide or a silicate of Hf, Al, Zr, La, Mg, Ba, Ti, Pb, any other suitable material, or combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric 1004 may optionally include a substantially thin oxide (e.g., SiOx) layer.

The gate metal may include a stack of multiple metal materials. For example, the gate metal may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vris achieved in the device that is to be formed. The work function layer(s) may be deposited by CVD, physical vapor deposition (PVD), ALD, and/or other suitable process.

In some embodiments, a subset of the second semiconductor layers 306 that are vertically arranged from one another is collectively configured as the channel structure of a GAA FET. As shown in FIG. 9, the subset of the second semiconductor layers 306 on the left-hand side may collectively function as the channel structure of a GAA FET 910; the subset of the second semiconductor layers 306 in the middle may collectively function as the channel structure of another GAA FET 920; and the subset of the second semiconductor layers 306 on the right-hand side may collectively function as the channel structure of yet another GAA FET 930. Each of the GAA FETs 910 to 930 can have its channel structure wrapped by a respective active gate structure (e.g., 900), and coupled to one or more source/drain structures (e.g., 802). Upon performing operation 116 of FIG. 1 (e.g., FIG. 9), fabrication of a logic portion of the disclosed semiconductor device 300 may be completed, in some embodiments. By forming a number of frontside interconnect structures, these GAA FETs (e.g., 910 to 930) can be operatively (e.g., electrically) coupled to one another, which will be discussed in operation 118 as follows.

Figure 10:
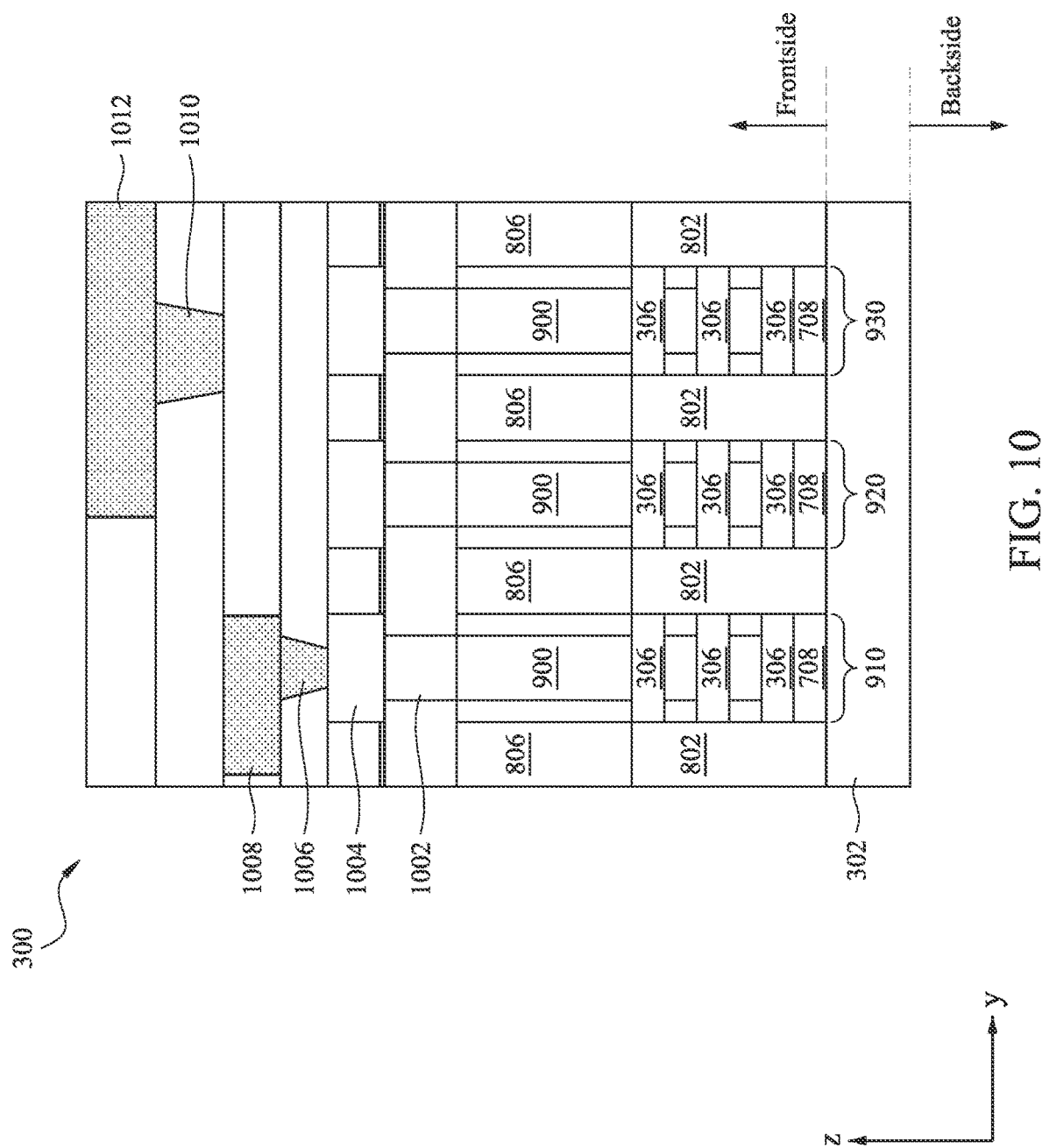

Corresponding to operation 118 of FIG. 1, FIG. 10 is a cross-sectional view of semiconductor device 300 (FIG. 2), cut along the Y-direction, which includes a number of frontside interconnect structures, 1002, 1004, 1006, 1008, 1010, and 1012, formed in one of the various stages of fabrication, in accordance with various embodiments.

The frontside interconnect structures 1002 to 1012 may be formed in multiple dielectric layers (e.g., interlayer dielectrics (ILDs) or intermetal dielectrics (IMDs)). Such a dielectric layer is sometimes referred to as a metallization layer. The semiconductor device 300 can include a number of (e.g., 10) these metallization layers disposed over a first side (e.g., frontside) of the substrate 302.

The ILD/IMD embedding those frontside interconnect structures 1002 to 1012 may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD.

The frontside interconnect structures 1002 to 1012 may be formed by at least some of the following processes. As a representative example, a recess may be formed in one of the ILDs/IMDs through an etching process, including various dry etching, wet etching, and/or other etching methods (e.g., reactive ion etching). The face of recess may be a rectangular shape, but the face of recess is not limited to a rectangular shape. Next, the recess is filled with a metal material, followed by a CMP process to remove any excess material so as to provide a level surface for the ILD/IMD. The frontside interconnect structures 1002 to 1012 formed across multiple ILD/IMD, as shown in FIG. 10, can be formed by repeating the foregoing processes. The metal material may include cobalt (Co), formed by a suitable method, such as PVD, CVD, electroplating, electroless plating, or the like. Besides cobalt, other material materials, such as copper (Cu), gold (Au), tungsten (W), Ruthenium (Ru), combinations thereof, multi-layers thereof, alloys thereof, or the like, may also be used to form the frontside interconnect structures 1002 to 1012.

As mentioned above, the frontside interconnect structures 1002 to 1012 are formed to electrically couple transistors (e.g., 910, 920, 930, etc.) of the logic portion of the semiconductor device 300. Although only the interconnect structure 1002 are shown to connect the respective gate structures 900 of the GAA FETs 910 to 930, it should be appreciated that at least one frontside interconnect structure can be connected to any of the source/drain structures of the GAA FETs 910 to 930 while remaining within the scope of the present disclosure.

After the frontside interconnect structures (e.g., 1002 to 1012) are formed, the workpiece may be flipped (operation 120) and be subject to further processing. For example, after forming a topmost metallization layer on the frontside of the substrate 302, a carrier substrate may be attached to the topmost metallization layer, followed by flipping the partially completed semiconductor device 300. Next, a number of backside interconnect structures (which include a number of power rails) and a memory portion of the semiconductor device 300 are formed, which will be discussed as follows.

Figure 11:
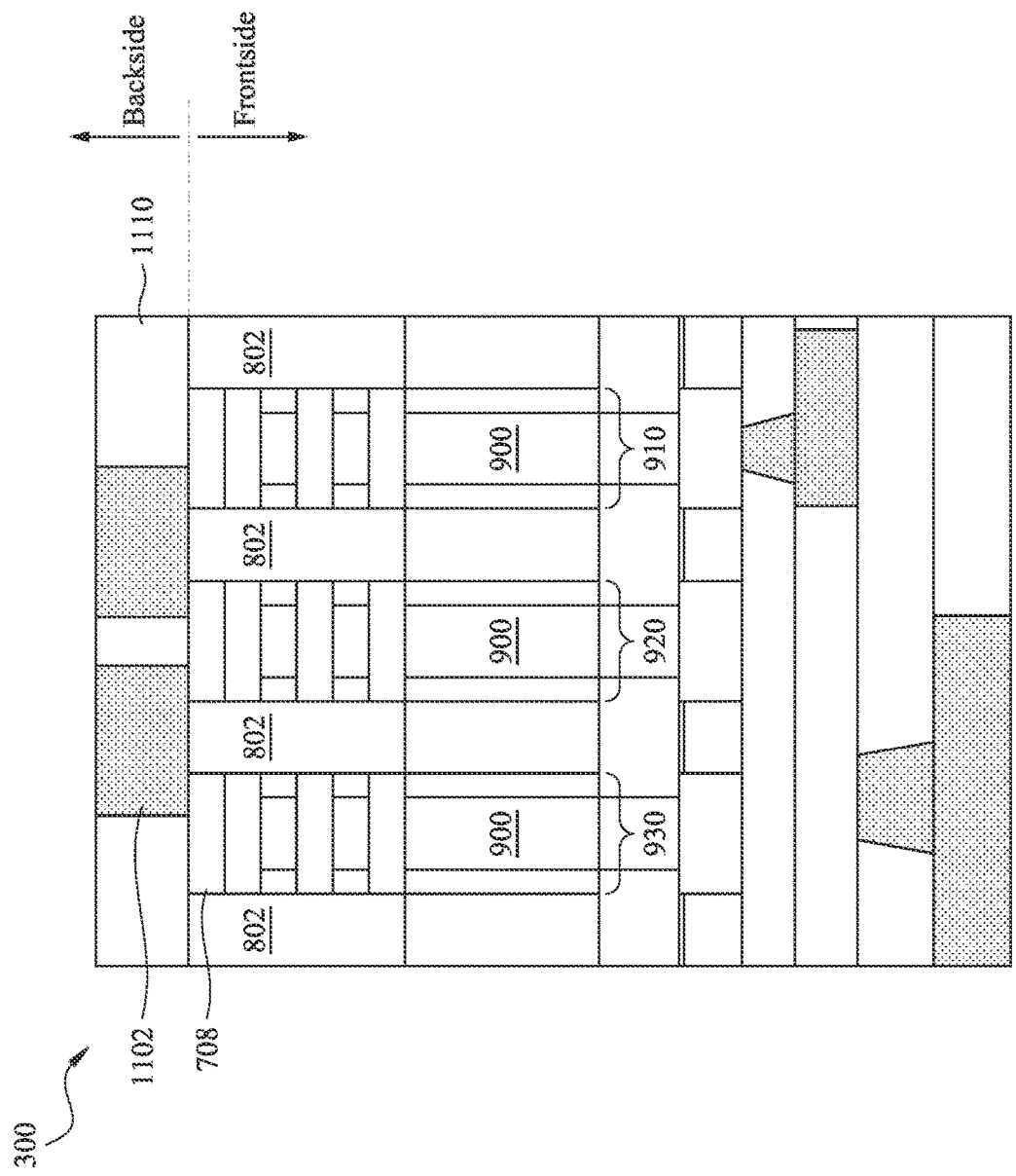

Corresponding to operation 122, FIG. 11 is a cross-sectional view of semiconductor device 300 (FIG. 2), which includes a number of first backside interconnect structures 1102 at one of the various stages of fabrication, in accordance with various embodiments. The first backside interconnect structures 1102 are each formed as a via to deliver power to the source/drain structures 802 from at least a power rail (which will be discussed in FIG. 12). The term "via" is generally referred to as a vertical interconnect structure that extends through one or more dielectric layers to electrically connect device components disposed along the top and bottom boundaries of the one or more dielectric layers.

To form the first backside interconnect structures 1102, at least some of the following processes are performed. In response to flipping the workpiece, a polishing process (e.g., a chemical mechanical polishing (CMP)) may be performed on the substrate 302 until the bottom isolation layer 708 is exposed. Next, a dielectric layer 1110 may be disposed over the back side of the semiconductor device 300. The dielectric layer 1110 may have a height in the Z-direction in a range in between about 5 to about 50 nanometers, inclusive (e.g., 5, 10, 15, 20, 25, 30, 35, 40, and 50 nanometers) or any other suitable height. The dielectric layer 1010 may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. The dielectric layer 1110 has a smaller dielectric constant than the typical SiN etch stop layer used in semiconductor devices.

A recess may be formed in the dielectric layer 1110 through an etching process, including various dry etching, wet etching, and/or other etching methods (e.g., reactive ion etching). The face of recess may be a rectangular shape, but the face of recess is not limited to a rectangular shape. In such embodiments, the width of the recess along the Y-direction may be between about 5 and about 35 nanometers, inclusive (e.g. 5, 10, 15, 20, 25, 30, and 35 nanometers). In such embodiments, the length of the recess along the X-direction may be between about 5 and about 105 nanometers, inclusive (e.g. 5, 15, 25, 35, 45, 55, 65, 75, 85, 95, and 105 nanometers). In some embodiments, the height of the recess along the Z-direction may be between about 20 and about 50 nanometers, inclusive (e.g., 20, 30, 40 and 50 nanometers).

The face of the recess may be formed in the shape of a triangle, trapezoid, circle, rectangle, or other combination of shapes thereof. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$, $C_4F_6$, $C_4F_8$), chlorine-containing gas (e.g., $Cl_2$, and/or $BCl_3$), bromine-containing gas (e.g., HBr), other suitable gases and/or plasmas, or combinations thereof.

The first backside interconnect structure 1102 may be formed by filling the recess in the dielectric layer 1110 with a metal material, followed by a CMP process to remove any excess material and provide a level surface for the first interconnect structure 1102. The metal material may include cobalt (Co), formed by a suitable method, such as PVD, CVD, electroplating, electroless plating, or the like. Besides cobalt, other material materials, such as copper (Cu), gold (Au), tungsten (W), Ruthenium (Ru), combinations thereof, multi-layers thereof, alloys thereof, or the like, may also be used to form the first backside interconnect structure 1102.

Figure 12:
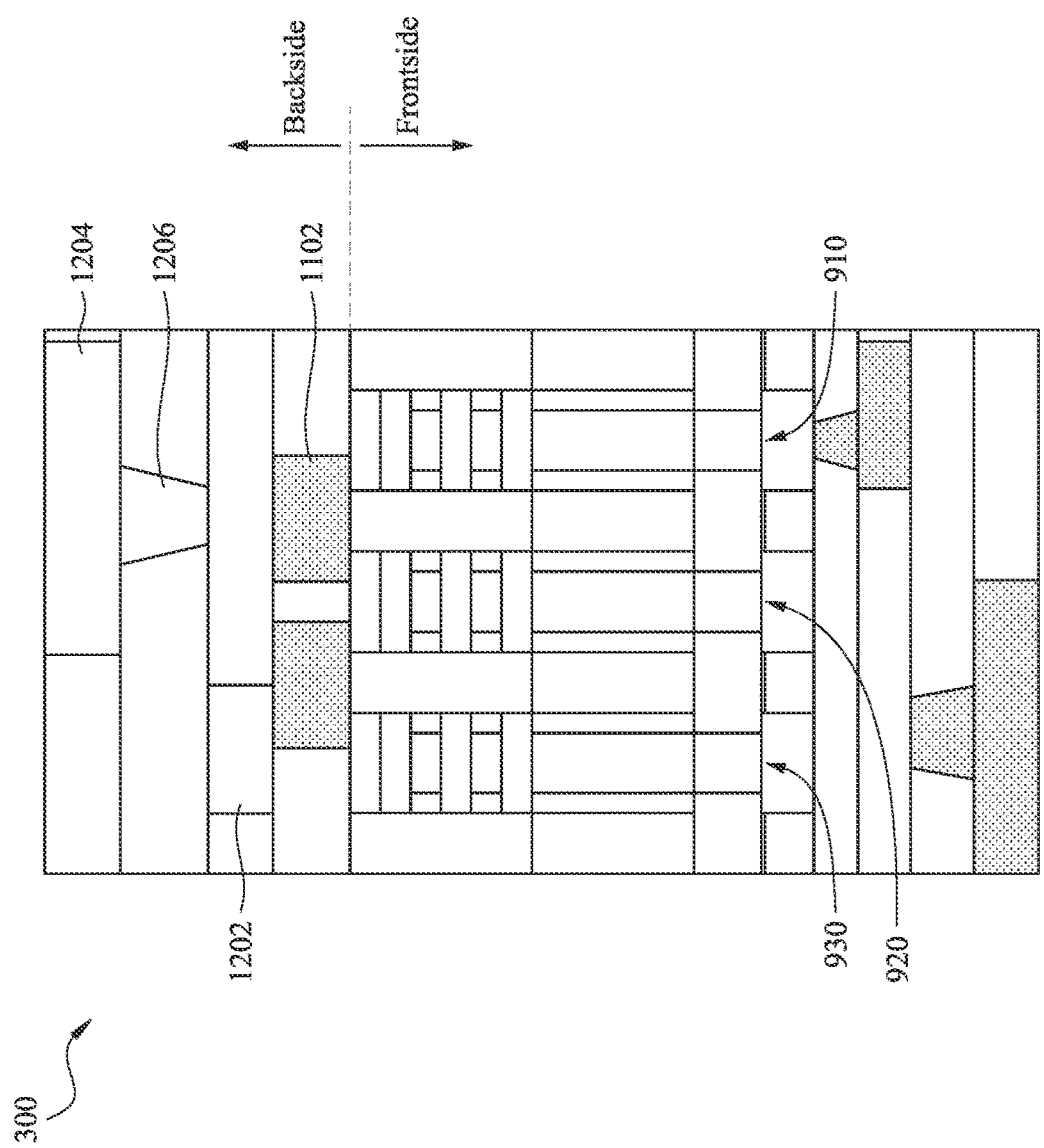

Corresponding to operation 124, FIG. 12 is a cross-sectional view of semiconductor device 300 (FIG. 2), which includes a number of second backside interconnect structure, 1202, 1204, and 1206, at one of the various stages of fabrication, in accordance with various embodiments. The second backside interconnect structures 1204 to 1206 may be formed in the same manner as the first backside interconnect structure 1102, and thus, the associated discussion (e.g., materials of the second backside interconnect structures 1202 to 1206, and methods of forming the same) will not be repeated.

In some embodiments, the first backside interconnect structures 1102 may be directly connected to the source/drain structures of the GAA FETs 910 to 930 (as discussed above), while some of the second backside interconnect structures may be configured as power rails each configured to carry a supply voltage to either a logic portion or a memory portion of the semiconductor device 300. For example in FIG. 12 (and the following figures), the second backside interconnect structure 1202 may function as a first power rail configured to carry a first supply voltage to a logic portion of the semiconductor device 300 (e.g., GAA FETs 910 to 930) through the first backside interconnect structures 1102, and the second backside interconnect structure 1204 may function as a second power rail configured to carry a second supply voltage to a memory portion of the semiconductor device 300. In some embodiments, the second supply voltage, which is configured to operate the memory portion, may be substantially higher than the first supply voltage, which is configured to operate the logic portion.

The first power rail 1202 is vertically disposed closer to the GAA FETs 910 to 930 (the logic portion) than the second power rail 1204 is, according to various embodiments of the present disclosure. With the first power rail 1202 formed right below the logic portion (when the workpiece is flipped back), more spaces are spared on the frontside of the semiconductor device 300, which can advantageously loosen various design rules to which the logic portion and the corresponding frontside interconnect structures are subjected. As a result, the logic portion of the semiconductor device 300 (e.g., transistors) can continue being scaled down without breaking the design rules. Further, a memory portion of the semiconductor device 300 can be formed right above the second power rail 1204 (when the workpiece remains flipped), which will be discussed as follows. With the second power rail 1204 configured to deliver the second supply voltage and formed right below the memory portion, less voltage drop may be present along a propagation path of the second supply voltage. Consequently, the memory portion of the semiconductor device 300 can be efficiently operated.

Figure 13A:
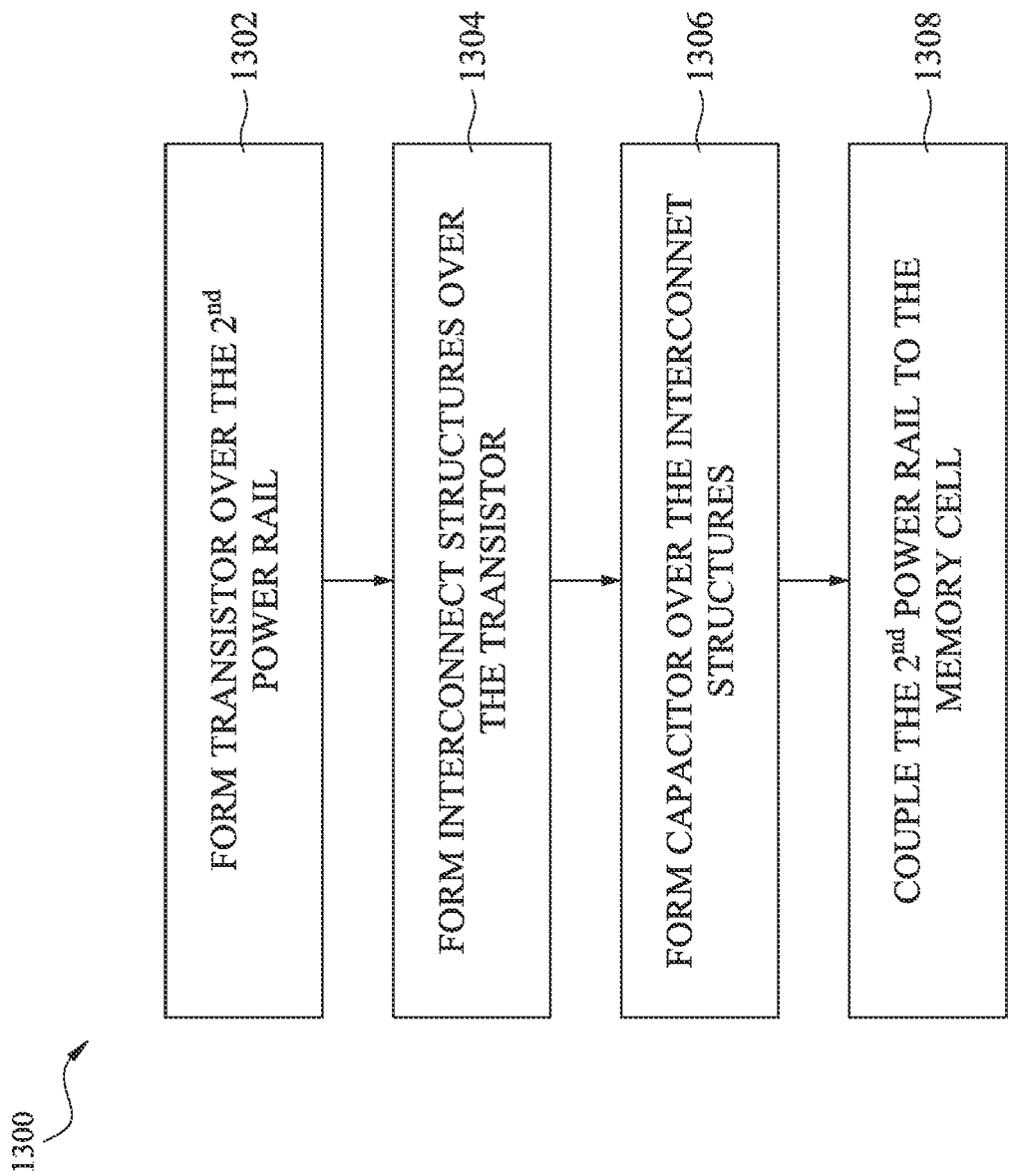
FIGS. 13A, 14A, and 15A each illustrate a flow chart of an example method for fabricating a memory portion of the example semiconductor device of FIGS. 3-12, in accordance with some embodiments.
Figure 13B:
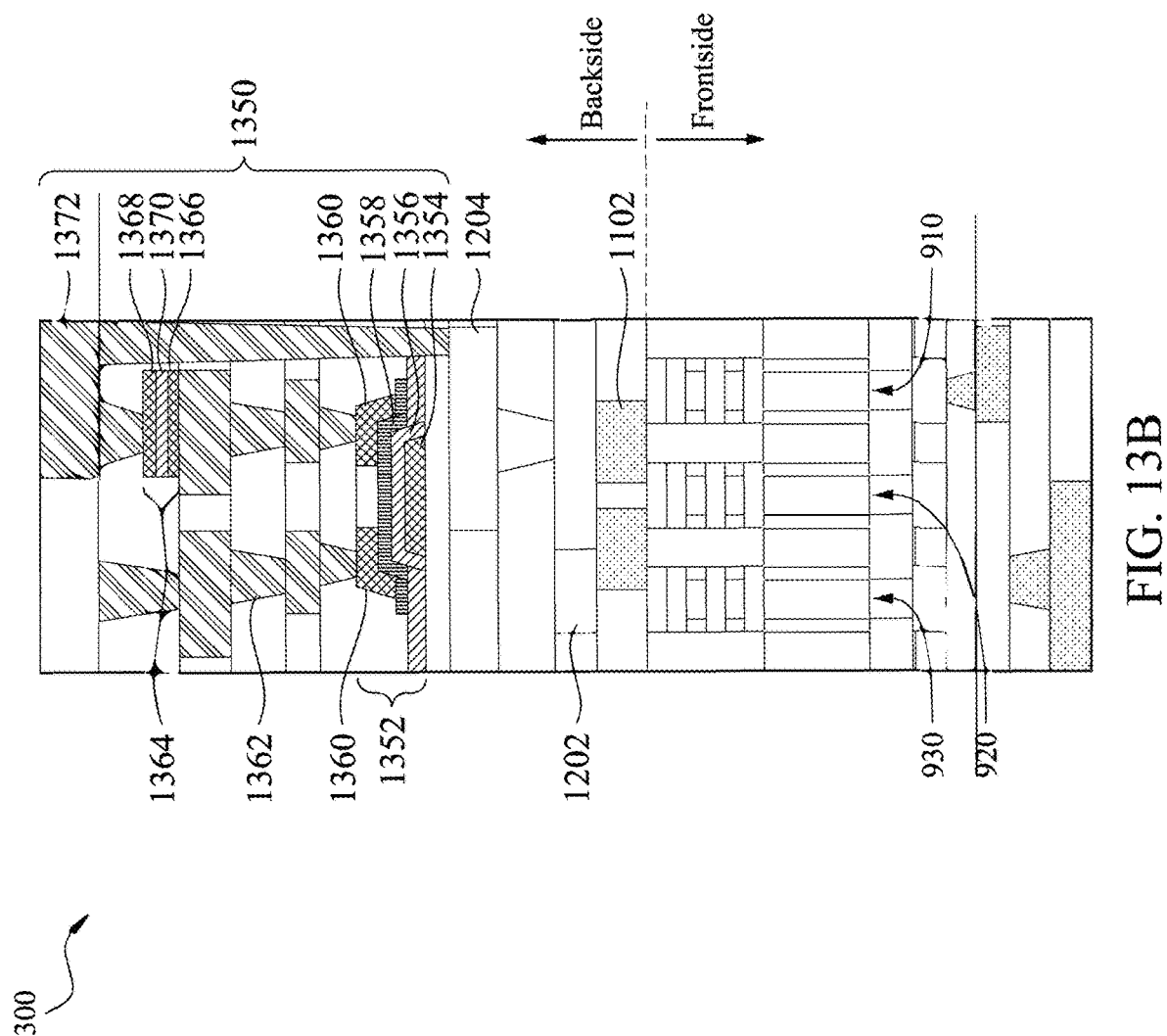
FIGS. 13B, 14B, and 15B illustrate the memory portions of the example semiconductor device, made by the method of FIGS. 13A, 14A, and 15A, respectively, in accordance with some embodiments.
Figure 14A:
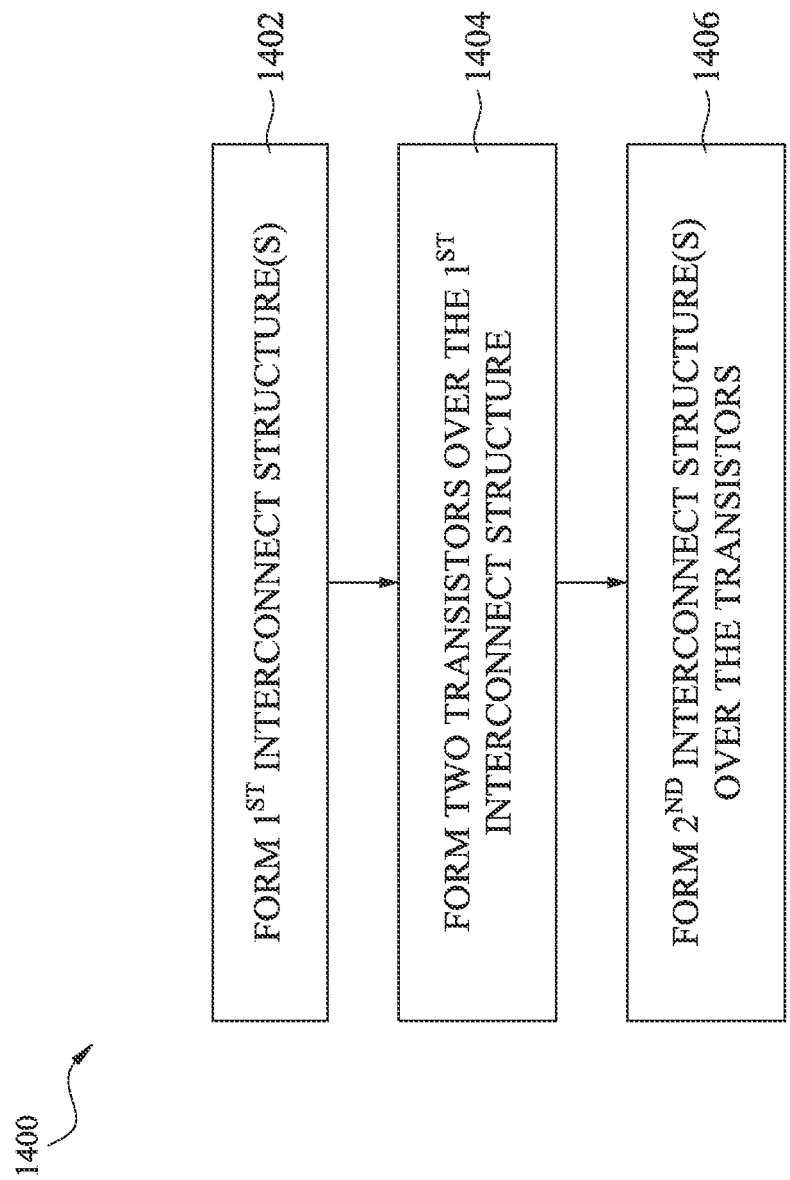
Figure 14B:
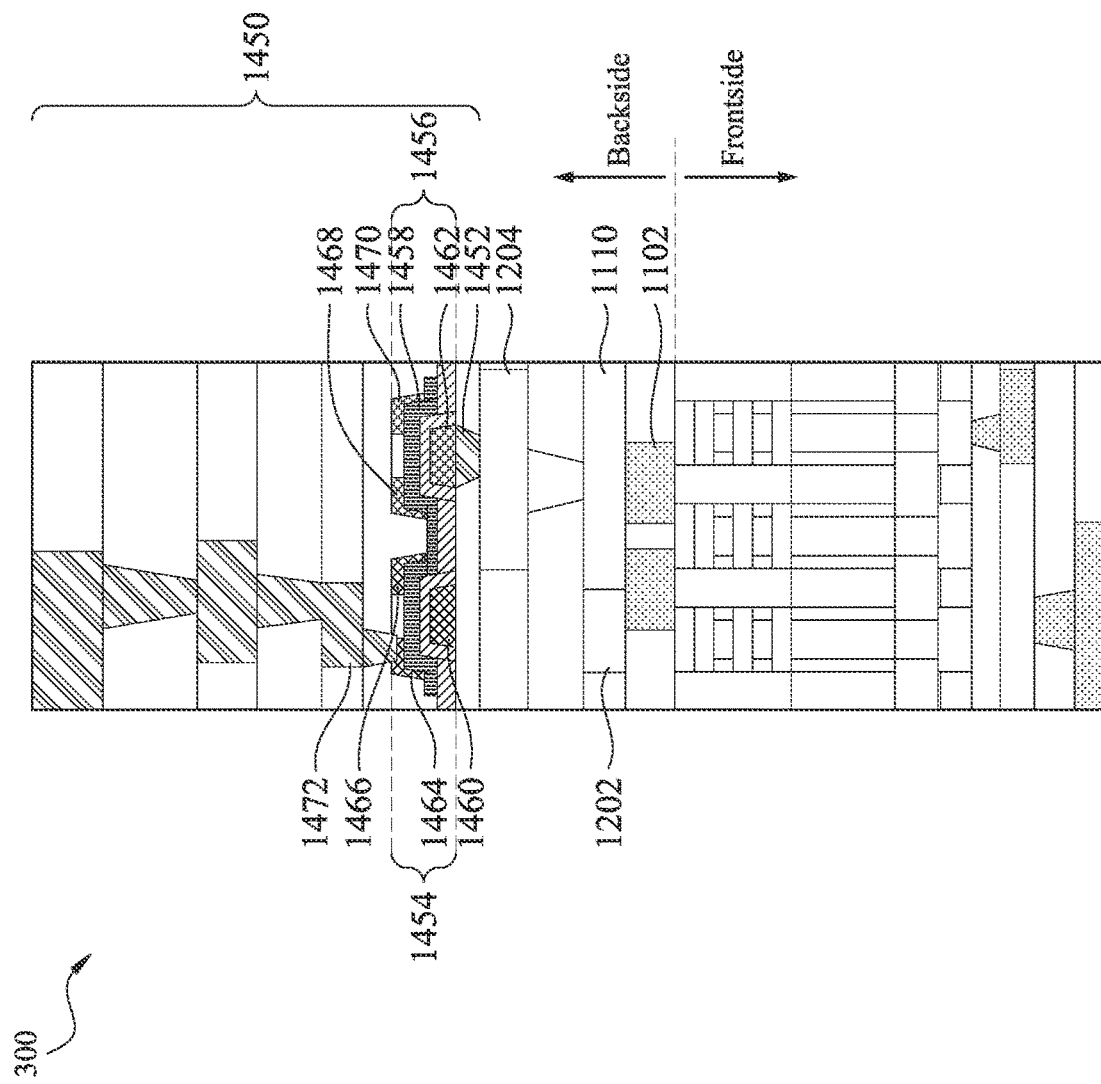
Figure 15A:
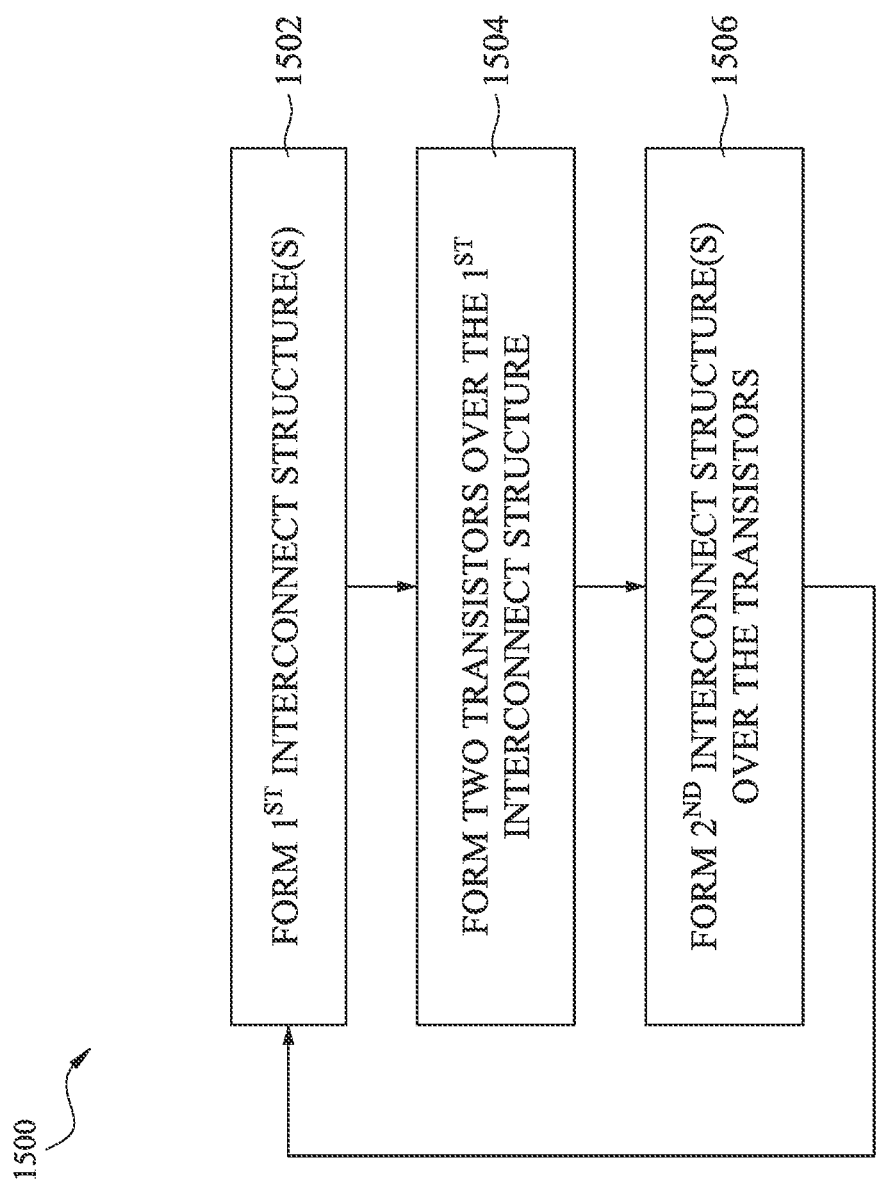

Corresponding to operation 126 of FIG. 1, FIGS. 13A, 14A, and 15A are each a flow chart of an example method for forming a memory portion of the semiconductor device 300, in accordance with various embodiments. For example, the method 1300 of FIG. 13A presents a number of operations to form a memory portion 1350 on the backside of the semiconductor device 300, as shown in FIG. 13B; the method 1400 of FIG. 14A presents a number of operations to form a memory portion 1450 on the backside of the semiconductor device 300, as shown in FIG. 14B; and the method 1500 of FIG. 15A presents a number of operations to form a memory portion 1550 on the backside of the semiconductor device 300, as shown in FIG. 15B.

Each of the memory portions 1350 to 1550 can include any number of memory cells formed on the backside. The memory cells can be formed as an array. The array can be arranged two-dimensionally or three-dimensionally. Further, the memory cells of each memory portion is powered by the second supply voltage delivered by the second power rail 1204, in accordance with various embodiments. Memory cell of the memory portion formed on the backside of the semiconductor device 300 may be selected from the group consisting of: a NAND flash memory cell, a NOR flash memory cell, a Static Random Access Memory (SRAM) cell, a Dynamic Random Access Memory (DRAM) cell, a Magnetoresistive Random Access Memory (MRAM) cell, a Phase Change Memory (PCM) cell, a Resistive Random Access Memory (ReRAM) cell, a 3D XPoint memory cell, a ferroelectric random-access memory (FeRAM) cell, and other types of memory cells that have been, are being, or will be developed.

Figure 15B:
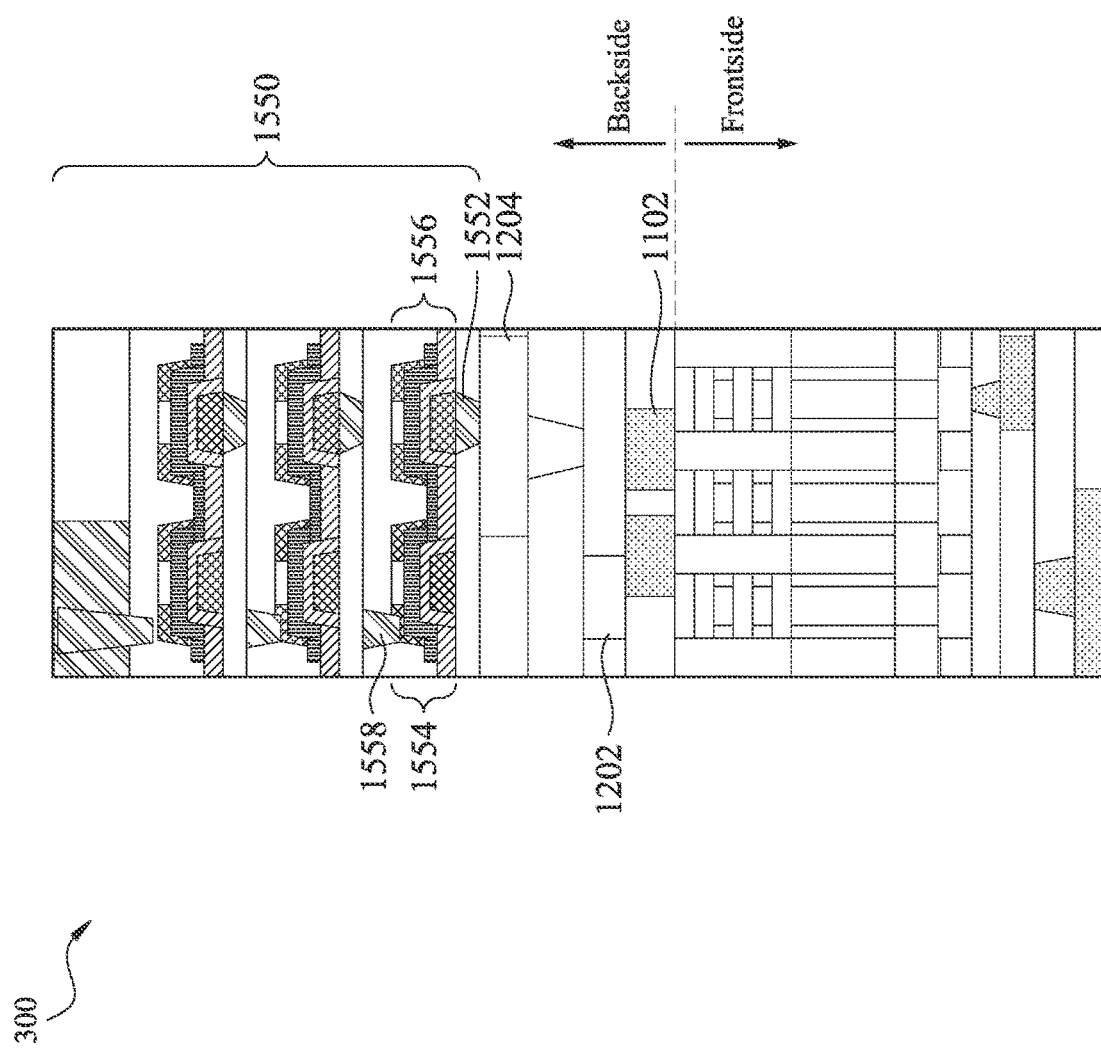

In the illustrative embodiment of FIG. 13B, the memory portion 1350 may include one memory cell implemented as one transistor (T) and one capacitor (C) coupled in series (e.g., an RRAM cell, a DRAM cell, an FRAM cell, an MRAM cell); in the illustrative embodiment of FIG. 14B, the memory portion 1450 may include one memory cell implemented as two transistors (T) coupled in series (e.g., an RRAM cell, a DRAM cell); and in the illustrative embodiment of FIG. 15B, the memory portion 1550 may include multiple cells stacked on top of one another, each of which is implemented as twos transistors coupled in series (e.g., an RRAM cell, a DRAM cell).

Examples of the transistor T include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In some embodiments, the transistor T may be formed under a relatively low temperature (e.g., under about 400° C.). For example, the transistor T can have its channel formed of a semiconductor material selected from the group consisting of: indium gallium zinc oxide (IGZO), indium tin oxide (ITO), indium zinc oxide (IZO), zinc oxide (ZnO), indium tungsten oxide (IWO), poly silicon, amorphous silicon, and combinations thereof. Some of the above-listed materials (e.g., IGZO, ITO, IZO, ZnO, IWO) are sometimes referred to as metal oxide semiconductor materials.

An example of the capacitor C includes, but is not limited to, a metal-insulator-metal (MIM) capacitor. Other capacitor configurations, e.g., MOS capacitor, are within the scopes of various embodiments. An MIM capacitor comprises a lower electrode, an upper electrode, and the insulating material sandwiched between the lower electrode and the upper electrode. Example materials of the insulating material include, but are not limited to, silicon dioxide, ZrO, TiO$_2$, HfOx, a high-k dielectric, or the like. Examples of high-k dielectrics include, but are not limited to, zirconium dioxide, hafnium dioxide, zirconium silicate, hafnium silicate, or the like. In at least one embodiment, the insulating material of the capacitor C is the same as or similar to a gate dielectric included in a transistor, such as the transistor T.

Referring first to FIG. 13A in conjunction with FIG. 13B, the method 1300 starts with operation 1302 of forming a transistor 1352 on the backside of the semiconductor device 300 (e.g., over the second power rail 1204), in accordance with various embodiments. As shown in FIG. 13B, the transistor 1352 includes a gate structure 1354, a high-k dielectric layer 1356, a channel (e.g., formed as a thin film) 1358, and source/drain structures (e.g., formed of a metal material) 1360. The transistor 1352 may be formed by sequentially depositing and patterning respective materials of the foregoing features. The transistor 1352 is sometimes referred to as a back-gate transistor.

Next (still referring to FIG. 13A in conjunction with FIG. 13B), the method 1300 proceeds to operation 1304 of forming a number of interconnect structures 1362 over the transistor 1352. The interconnect structures 1362 may be formed in the same manner as the above-described frontside/backside interconnect structures, and thus, the associated discussion (e.g., materials of the interconnect structures 1362, and methods of forming the same) will not be repeated.

Next (still referring to FIG. 13A in conjunction with FIG. 13B), the method 1300 proceeds to operation 1306 of forming a capacitor 1364 over the interconnect structures 1362. As shown in FIG. 13B, the capacitor 1364 is implemented as a MIM structure, which includes a bottom electrode 1366, a top electrode 1368, and an insulating material 1370 interposed between the top and bottom electrodes. In some embodiments, the capacitor 1364 is formed compatibly with the above-described frontside/backside interconnect structures, and thus, the associated discussion will not be repeated. Upon forming the capacitor 1364, a memory cell can be formed or otherwise defined. Specifically, one of the source/drain structures 1360 of the transistor 1352 is coupled to the bottom electrode 1366 of the capacitor 1364, which causes the transistor 1352 and capacitor 1364 to couple to each other in series. In some embodiments, the capacitor 1364 serves as a storage unit of this memory cell, while the transistor 1352 serves as a switch to allow access (e.g., program, read, erase) of this memory cell.

Next (still referring to FIG. 13A in conjunction with FIG. 13B), the method 1300 proceeds to operation 1308 of coupling the second power rail 1204 to the memory cell constituted by the transistor 1352 and capacitor 1364. For example, upon forming the capacitor 1364, one or more interconnect structures (e.g., 1372) may be formed to electrically couple the second power rail 1204 to the top electrode 1368 of the capacitor 1364. As such, in response to switching on the transistor 1352, the second power rail 1204 can apply the second supply voltage to the capacitor 1364, thereby programming the capacitor 1364.

Referring now to FIG. 14A in conjunction with FIG. 14B, the method 1400 starts with operation 1402 of forming a number of first interconnect structures 1452 on the backside of the semiconductor device 300 (e.g., over the second power rail 1204), in accordance with various embodiments. The first interconnect structures 1452 may be formed in the same manner as the above-described frontside/backside interconnect structures, and thus, the associated discussion (e.g., materials of the first interconnect structures 1452, and methods of forming the same) will not be repeated. In some embodiments, at least one of the first interconnect structures 1452 is configured to electrically couple the second power rail 1204 to a gate structure of one of the serially coupled transistors formed over the first interconnect structures 1452 (which will be discussed as follows).

Next (still referring to FIG. 14A in conjunction with FIG. 14B), the method 1400 continues to operation 1404 of forming a pair of transistors 1454 and 1456 over the first interconnect structures 1452, in accordance with various embodiments. As shown in FIG. 14B, each of the transistors 1454 and 1456 is formed as a back-gate transistor, just like the transistor 1352 of FIG. 13B, and thus, the associated description will be briefly repeated as follows.

In some embodiments, the transistors 1454 and 1456 are coupled to each other in series. Different from the transistor 1352 of FIG. 13B, the transistors 1454 and 1456 may share a common channel 1458, with respective gate structures 1460 and 1462 coupled to respective different interconnect structures. For example, the gate structure 1462 is coupled to one of the first interconnect structures 1452, while the gate structure is coupled to another interconnect structure (not shown). Further, the transistor 1454 has its source/drain structures 1464 and 1466; and the transistor 1456 has its source/drain structures 1468 and 1470, in which one of the source/drain structures of one of the transistors (e.g., 1464) is coupled to a second interconnect structure, which will be described as follows. With the second power rail 1204 coupled to the gate structure 1462 of the transistor 1456 through the first interconnect structure 1452, the second power rail 1204 can apply the second supply voltage to the transistor 1456, thereby programming the transistor 1456.

Next (still referring to FIG. 14A in conjunction with FIG. 14B), the method 1400 continues to operation 1406 of forming a number of second interconnect structures 1472 over the transistors 1454 and 1456, in accordance with various embodiments. The second interconnect structures 1472 may be formed in the same manner as the above-described frontside/backside interconnect structures, and thus, the associated discussion (e.g., materials of the second interconnect structures 1472, and methods of forming the same) will not be repeated. In some embodiments, at least one of the second interconnect structures 1472 is configured to be electrically coupled to one of the source/drain structures of one of the transistors (e.g., 1464).

Referring then to FIG. 15A in conjunction with FIG. 15B, the method 1500 includes operation 1502, 1504, and 1506, which are substantially similar to operations 1402, 1404, and 1406, respectively, in accordance with various embodiments. Thus, the associated discussion will not be repeated. However, the method 1500 may further include repeating operations 1502 to 1506 as desired. As such, multiple layers, each of which is substantially similar to the structure shown in FIG. 14B, may be formed over the second power rail 1204. For example, by iterating operations 1502 to 1506 three times, the memory portion 1550 includes three layers formed over the second power rail 1204. Each of the layers includes a first interconnect structure 1552, two transistors 1554 and 1556 (a gate structure of one of which is coupled to the first interconnect structure), and a second interconnect structure 1558 (coupled to a source/drain structure of one of the transistors 1554 and 1556).

In one aspect of the present disclosure, a semiconductor device is disclosed. The semiconductor device includes a first transistor formed on a first side of a substrate. The semiconductor device includes a first power rail structure vertically disposed over the first transistor, a second power rail structure vertically disposed over the first power rail structure, and a memory portion vertically disposed over the second power rail structure, wherein the first power rail structure, and a second power rail structure, and the memory portion are all disposed on a second side of the substrate opposite to the first side.

In another aspect of the present disclosure, a semiconductor device is disclosed. The semiconductor device includes a plurality of nanostructures disposed on a first side of a substrate, each of the plurality of nanostructures vertically spaced from one another. The semiconductor device further includes a first gate structure wrapping around each of the plurality of nanostructures, a first power rail structure disposed on a second side of the substrate, wherein the second side is opposite to the first side. The semiconductor device further includes a second power rail structure also disposed on the second side and vertically disposed over the first power rail structure, and a first thin film comprising a metal oxide semiconductor material, wherein the first thin film is also disposed on the second side and is vertically disposed over the second power rail structure.

In yet another aspect of the present disclosure, a method for fabricating a semiconductor device is disclosed. The method includes forming a first transistor on a first side of a substrate, wherein the first transistor has at least one of its nanostructures wrapped by a gate structure. The method further includes flipping the substrate, forming a first power rail structure on a second, opposite side of the substrate, wherein the first power rail structure is operatively coupled to the first transistor, forming a second power rail structure over the first power rail structure, and forming a second transistor over the second power rail structure, wherein the second transistor has a channel formed as a metal oxide thin film and is operatively coupled to the second power rail structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first transistor formed on a first side of a substrate and functioning as a portion of a logic device;
   a first power rail structure vertically disposed over the first transistor and operatively coupled to the logic device;
   a second power rail structure vertically disposed over the first power rail structure; and
   a memory portion vertically disposed over the second power rail structure and operatively coupled to the second power rail structure;
   wherein the first power rail structure, the second power rail structure, and the memory portion are all disposed on a second side of the substrate opposite to the first side, and wherein a total size of the first power rail structure is smaller than a total size of the second power rail structure.

2. The memory device of claim 1, wherein the first power rail structure is configured to provide a first supply voltage to the transistor, and the second power rail structure is configured to provide a second supply voltage to the memory portion.

3. The memory device of claim 2, wherein a level of the second supply voltage is substantially higher than a level of the first supply voltage.

4. The memory device of claim 1, wherein the first transistor comprises:
   a plurality of nanostructures; and
   a source/drain structure laterally coupled to one end of each of the plurality of nanostructures.

5. The memory device of claim 4, wherein the first transistor further comprises a gate structure wrapping around each of the plurality of nanostructures.

6. The memory device of claim 4, further comprising a first via structure interposed between the source/drain structure and the first power rail structure.

7. The memory device of claim 1, wherein the memory portion comprises a plurality of memory cells, each of the memory cells including a resistive random access memory (RRAM) cell, a dynamic random access memory (DRAM) cell, a ferroelectric random access memory (FeRAM) cell, or a magnetoresistive random access memory (MRAM) cell.

8. The memory device of claim 1, wherein the memory portion comprises a plurality of memory cells, each of the memory cells including a second transistor and a capacitor that are coupled in series.

9. The memory device of claim 8, wherein the second transistor has its channel formed of a metal oxide semiconductor material.

10. The memory device of claim 1, wherein the memory portion comprises a plurality of memory cells, each of the memory cells including a third transistor and a fourth transistor that are coupled in series.

11. The memory device of claim 10, wherein the third and fourth transistors each have its channel formed of a metal oxide semiconductor material.

12. A semiconductor device, comprising:
a plurality of nanostructures disposed on a first side of a substrate and functioning as a portion of a logic device, each of the plurality of nanostructures vertically spaced from one another;
a first gate structure wrapping around each of the plurality of nanostructures;
a first power rail structure disposed on a second side of the substrate, the second side being opposite to the first side and operatively coupled to the logic device;
a second power rail structure also disposed on the second side, and vertically disposed over the first power rail structure; and
a first thin film comprising a metal oxide semiconductor material and functioning as a portion of a memory device, wherein the first thin film is also disposed on the second side and is vertically disposed over the second power rail structure, wherein the second power rail structure is operatively coupled to the memory device, and wherein a total size of the first power rail structure is smaller than a total size of the second power rail structure.

13. The semiconductor device of claim 12, wherein the first power rail structure is configured to provide a first supply voltage to conduct current flowing through the plurality of nanostructures, and the second power rail structure is configured to provide a second supply voltage to conduct current flowing through the first thin film.

14. The semiconductor device of claim 13, wherein a level of the second supply voltage is substantially higher than a level of the first supply voltage.

15. The semiconductor device of claim 12, further comprising a second gate structure disposed on the second side, wherein the first thin film overlays the second gate structure with a gate dielectric layer interposed therebetween.

16. The semiconductor device of claim 12, further comprising a metal-insulator-metal structure disposed on the second side, wherein the metal-insulator-metal structure is electrically coupled to the first thin film.

17. The semiconductor device of claim 12, further comprising a second thin film comprising the metal oxide semiconductor material, wherein the second thin film is laterally disposed next to the first thin film.

18. The semiconductor device of claim 12, further comprising a third thin film comprising the metal oxide semiconductor material, wherein the third thin film is vertically disposed over the first thin film.

19. A method for fabricating a memory device, comprising:
forming a first transistor on a first side of a substrate, wherein the first transistor has at least one of its nanostructures wrapped by a gate structure, wherein the first transistor is configured to operate as a portion of a logic device;
flipping the substrate;
forming a first power rail structure on a second, opposite side of the substrate, wherein the first power rail structure is operatively coupled to the first transistor;
forming a second power rail structure over the first power rail structure; and
forming a second transistor over the second power rail structure, wherein the second transistor has a channel formed as a metal oxide thin film and is operatively coupled to the second power rail structure, wherein the second transistor is configured to operate as a portion of a memory device, and wherein a total size of the first power rail structure is smaller than a total size of the second power rail structure.

20. The method of claim 19, prior to flipping the substrate, further comprising forming a plurality of interconnect structures over the first transistor on the first side, wherein at least one of the plurality of interconnect structures is operatively coupled to the first transistor.

* * * * *